United States Patent
Liang et al.

(10) Patent No.: US 9,025,418 B2
(45) Date of Patent: May 5, 2015

(54) INTELLIGENT PATCHING SYSTEMS USING ACOUSTIC CONTROL SIGNALS AND RELATED EQUIPMENT AND METHODS

(75) Inventors: Hongwei Liang, Plano, TX (US);
Edmond Richer, Richardson, TX (US);
Jeffrey D. Nielson, Wylie, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 462 days.

(21) Appl. No.: 13/463,923

(22) Filed: May 4, 2012

(65) Prior Publication Data

US 2012/0281509 A1  Nov. 8, 2012

Related U.S. Application Data

(60) Provisional application No. 61/482,729, filed on May 5, 2011.

(51) Int. Cl.
H04Q 1/00 (2006.01)
H04Q 1/02 (2006.01)
G01R 31/04 (2006.01)

(52) U.S. Cl.
CPC .............. *H04Q 1/136* (2013.01); *G01R 31/045* (2013.01)

(58) Field of Classification Search
CPC ..................................................... H04Q 1/136
USPC ........... 367/197, 137; 340/10.1, 8.1; 385/135; 439/488–491, 955
See application file for complete search history.

(56) References Cited

U.S. PATENT DOCUMENTS

| | | | |
|---|---|---|---|
| 7,605,707 B2 | 10/2009 | German et al. | |
| 2004/0219824 A1* | 11/2004 | Conn | 439/490 |
| 2008/0122579 A1* | 5/2008 | German et al. | 340/10.1 |
| 2010/0316334 A1* | 12/2010 | Kewitsch | 385/78 |
| 2014/0079400 A1* | 3/2014 | Sengupta | 398/79 |

FOREIGN PATENT DOCUMENTS

DE    10 2007 039294    5/2008

OTHER PUBLICATIONS

International Preliminary Report on Patentability Corresponding to International Application No. PCT/US2012/036515; Date of Mailing: Nov. 14, 2013; 9 Pages.
Invitation to Pay Additional Fees and Partial International Search for PCT application PCT/US2012/036515, Date of mailing Aug. 17, 2012.
International Search Report Corresponding to International Application No. PCT/US2012/036515; Date of Mailing: Oct. 29, 2012; 14 Pages.

(Continued)

*Primary Examiner* — Edwin Holloway, III
(74) *Attorney, Agent, or Firm* — Myers Bigel Sibley & Sajovec, P.A.

(57) ABSTRACT

Methods of identifying patching connections in a communications system are provided in which an acoustic signal generator is used to transmit an acoustic signal that includes a unique identifier embedded therein over a patch cord from a first connector port to a second connector port. The acoustic signal is received at the second connector port. The unique identifier is extracted from the acoustic signal. Finally, a patching connection between the first connector port and the second connector port is logged in a database.

15 Claims, 13 Drawing Sheets

(56) References Cited

OTHER PUBLICATIONS

Bao L. et al. "A thin liquid film thickness shear mode bulk acoustic wave sensor for determination of *Proteus mirabilis*", *Talanta*, Apr. 1996; 43(4):675-680 (Abstract Only).

Drafts B. "Acoustic Wave Technology Sensors", *Sensors Mag*, Oct. 1, 2000, Retrieved from the internet on Mar. 31, 2011 at URL http://www.sensorsmag.com/sensors/acoustic-ultrasound/acoustic-wave-technology-sensors-936.

* cited by examiner

INTELLIGENT PATCHING SYSTEMS USING ACOUSTIC CONTROL SIGNALS AND RELATED EQUIPMENT AND METHODS

CROSS REFERENCE TO RELATED APPLICATION

The present application claims priority under 35 U.S.C. §119 to U.S. Provisional Application Ser. No. 61/482,729, filed May 5, 2011, the entire content of which is incorporated herein by reference as if set forth in its entirety.

FIELD OF THE INVENTION

This invention generally relates to communications systems and, more particularly, to automatically tracking patching connections in communications systems.

BACKGROUND

Most businesses, government agencies, schools and other organizations employ dedicated communications systems (also referred to as "networks") that enable computers, servers, printers, facsimile machines, telephones and the like to communicate with each other, through a private network, and with remote locations via a telecommunications service provider. Such communications system may be hard-wired through, for example, the walls and/or ceilings of a building using communications cables and connectors. Communications cables that contain eight insulated conductors such as copper wires that are arranged as four differential twisted pairs of conductors (herein "Ethernet cables") and/or fiber optic communications cables are typically used in these hard-wired communications systems. Individual communications connectors (which are also referred to herein as "connector ports") such as RJ-45 style modular wall jacks are mounted in offices, conference rooms and other work areas throughout the building. The communications cables and any intervening connectors provide communications paths from the connector ports (e.g., modular wall jacks) in offices and other rooms, hallways and common areas of the building to network equipment (e.g., network switches, servers, memory storage devices, etc.) that may be located in a computer room, telecommunications closet or the like. Communications cables from external telecommunication service providers may also terminate within the computer room or telecommunications closet.

A commercial data center is a facility that may be used to run the computer-based applications that handle the core electronic business and operational data of one or more organizations. The expansion of the Internet has also led to a growing need for a so-called "Internet data centers," which are data centers that are used by online retailers, Internet portals, search engine companies and the like to provide large numbers of users simultaneous, secure, high-speed, fail-safe access to their web sites. Both types of data centers may host hundreds, thousands or more servers, routers, memory storage systems and other associated equipment. In these data centers, fiber optic and/or Ethernet cables are typically used to provide a hard-wired communications system that interconnects the data center equipment.

In both office network and data center communications systems, the communications cables that are connected to end devices (e.g., network servers, memory storage devices, network switches, work area computers, printers, facsimile machines, telephones, etc.) may terminate into one or more communications patching systems that may simplify later connectivity changes. Typically, a communications patching system includes one or more "patch panels" that are mounted on equipment rack(s) or in cabinet(s), and a plurality of "patch cords" that are used to make interconnections between different pieces of equipment. As is known to those of skill in the art, a "patch cord" refers to a communications cable (e.g., an Ethernet cable or a fiber optic cable) that has a connector such as, for example, an RJ-45 plug or a fiber optic connector, on at least one end thereof. A "patch panel" refers to an inter-connection device that includes a plurality of connector ports. Each connector port (e.g., an RJ-45 jack or a fiber optic adapter) on a patch panel may have a plug aperture on a front side thereof that is configured to receive the connector of a patch cord, and the back end of each connector port may likewise include a plug aperture that is configured to receive a patch cord or, alternatively, may be configured to receive the individual transmission paths (e.g., copper wires or optical fibers) of a communications cable that does not include a plug connector. Each connector port on a patch panel acts to connect the one or more transmission paths of the cable/patch cord that is plugged into the front side of the connector port with respective corresponding transmission paths of the cable/patch cord that is terminated into the back end of the connector port. The patching system may optionally include a variety of additional equipment such as rack managers, system managers and other devices that facilitate making and/or tracking patching connections.

So called "horizontal" cables are typically used to connect work area outlets or data center end devices to the back end of respective connector ports on a first set of patch panels. In an "inter-connect" patching system, a single set of patch cords is used to directly connect the connector ports on the first set of patch panels to respective connector ports on network switches. In a "cross-connect" patching system, a second set of patch panels is provided, and the first set of patch cords is used to connect the connector ports on the first set of patch panels to respective connector ports on the second set of patch panels, and a second set of patch cords is used to connect the connector ports on the second set of patch panels to respective connector ports on the network switches.

The connections between the work area end devices and the network switches and the connections in a data center may need to be changed for a variety of reasons, including equipment changes, adding or deleting users, office moves, etc. In an inter-connect patching system, these connections are typically changed by rearranging the patch cords in the set of patch cords that run between the first set of patch panels and the network switches. In a cross-connect patching system, the connections between the work area end devices and the network switches are typically changed by rearranging the patch cords in the set of patch cords that run between the first set of patch panels and the second set of patch panels. Both types of patching systems allow a network manager to easily implement connectivity changes by simply unplugging one end of a patch cord from a first connector port on one of the patch panels in the first set of patch panels and then plugging that end of the patch cord into a second connector port on one of the patch panels in the first set of patch panels.

The end-to-end connectivity between the connector ports on the network switches and the work area outlets or end devices are typically recorded in a computer-based log. Each time patching changes are made, this computer-based log is updated to reflect the new patching connections. Unfortunately, in practice technicians may neglect to update the log each and every time a change is made, and/or may make errors in logging changes. As such, the logs may not be complete and/or accurate.

In order to reduce or eliminate such logging errors, a variety of systems have been proposed that automatically log the patch cord connections in a communications patching system (i.e., to automatically determine which connector ports in the communications system are connected by patch cords). These automated patching systems typically use special "intelligent" patch panels that employ sensors, radio frequency identification tags, serial ID chips and the like and/or special patch cords that include an additional conductor and/or integrated circuit chips in the plugs thereof that are used in automatically tracking patching connections. However, existing solutions may be expensive, require the use of customized equipment, or may not work with all types of communications patching systems.

SUMMARY

Pursuant to embodiments of the present invention, methods of identifying patching connections in a communications system are provided. Pursuant to these methods, an acoustic signal generator is used to transmit an acoustic signal that includes a unique identifier embedded therein over a patch cord from a first connector port to a second connector port. The acoustic signal is received at the second connector port. The unique identifier is extracted from the acoustic signal. Finally, a patching connection between the first connector port and the second connector port is logged in a database.

In some embodiments, the acoustic signal is a vibration signal. In other embodiments, the acoustic signal is an ultrasonic pressure wave. In certain specific embodiments, the acoustic signal is a pressure wave that has a frequency between about 20 kHz and about 2 MHz. The unique identifier may be embedded in the acoustic signal by, for example, encoding the unique identifier into one or more of a frequency of the acoustic signal, an amplitude of the acoustic signal and/or a duration of the acoustic signal. An acoustic signal detector may be used to convert the received acoustic signal into an electrical signal so that the unique identifier may be extracted from the electrical signal. In some embodiments, a sleeve may be energized to inject the acoustic signal onto an optical fiber of the patch cord. In some embodiments, the acoustic signal may be injected through a ferrule of a termination of the patch cord onto an optical fiber of the patch cord.

Pursuant to further embodiments of the present invention, fiber optic patch panels are provided that include a mounting frame and a plurality of fiber optic connector ports that are mounted on the mounting frame. At least one acoustic signal generator may be provided that is configured to generate an acoustic control signal in response to a control signal from a processor that is in communication with the acoustic signal generator. An output of the acoustic signal generator is positioned to inject the acoustic control signal onto an optical fiber of a fiber optic patch cord when the fiber optic patch cord is received within a first of the plurality of connector ports.

In some embodiments, each of the connector ports may include an associated plug insertion/removal detector. The acoustic signal generator may be configured to generate, for example, an acoustic control signal that has a frequency of less than about 2 MHz. The acoustic signal generator may be configured to generate an ultrasonic pressure wave. In some embodiments, the acoustically active ferrule may be positioned between an output of the acoustic signal generator and the optical fiber of the fiber optic patch cord. In some embodiments, the output of the acoustic signal generator may be positioned to inject the acoustic control signal directly onto an exposed portion of the optical fiber of the fiber optic patch cord. The acoustic control signal may be injected into the optical fiber at an angle of incidence that results in an injected acoustic control signal that propagates through a glass core of the optical fiber at a desired angle of propagation.

In some embodiments, the acoustic signal generator may include a piezoelectric material. Moreover, the fiber optic patch panel may further include an acoustic signal detector that includes a piezoelectric material. In some embodiments, the acoustic signal generator may be positioned within the first of the plurality of connector ports and may at least partially surround a sleeve that is configured to receive a ferrule. In other embodiments, the acoustic signal generator may be located in a plug termination of the fiber optic patch cord. In some embodiments, the acoustic signal generator may be in communication with the processor via an electrical path that includes a capacitively coupled signal or an inductively coupled signal. In some embodiments, the acoustic signal generator may be part of or attached to a ferrule barrel that is included at least partly within the plug termination Pursuant to still further embodiments of the present invention, methods of identifying a patching connection in a communications system are provided in which an acoustic signal generator is used to generate an acoustic control signal. The acoustic control signal is injected through an acoustically active ferrule onto an optical fiber of a fiber optic patch cord that is received in a first connector port. The acoustic control signal is extracted from the optical fiber at a second connector port. The existence of a patching connection extending between the first connector port and the second connector port may then be identified based at least in part on receipt of the acoustic control signal at the second connector port.

In some embodiments, the acoustic control signal may be injected into the optical fiber at an angle of incidence that results in an injected acoustic control signal that propagates through a glass core of the optical fiber at an angle of propagation of between about 0 degrees and about 5 degrees. The acoustic control signal may be an ultrasonic pressure wave that has a frequency between about 20 kHz and about 2 MHz. An end of the optical fiber may be beveled to increase the amount of signal energy from the acoustic control signal that is extracted from the optical fiber at the second connector port. The acoustic signal generator may be located in a termination of a patch cord that is received within the first connector port. In some embodiments, the acoustic signal generator may at least partially surround a sleeve that is located within the connector port and that receives the acoustically active ferrule.

DETAILED DESCRIPTION

Figure 1A:
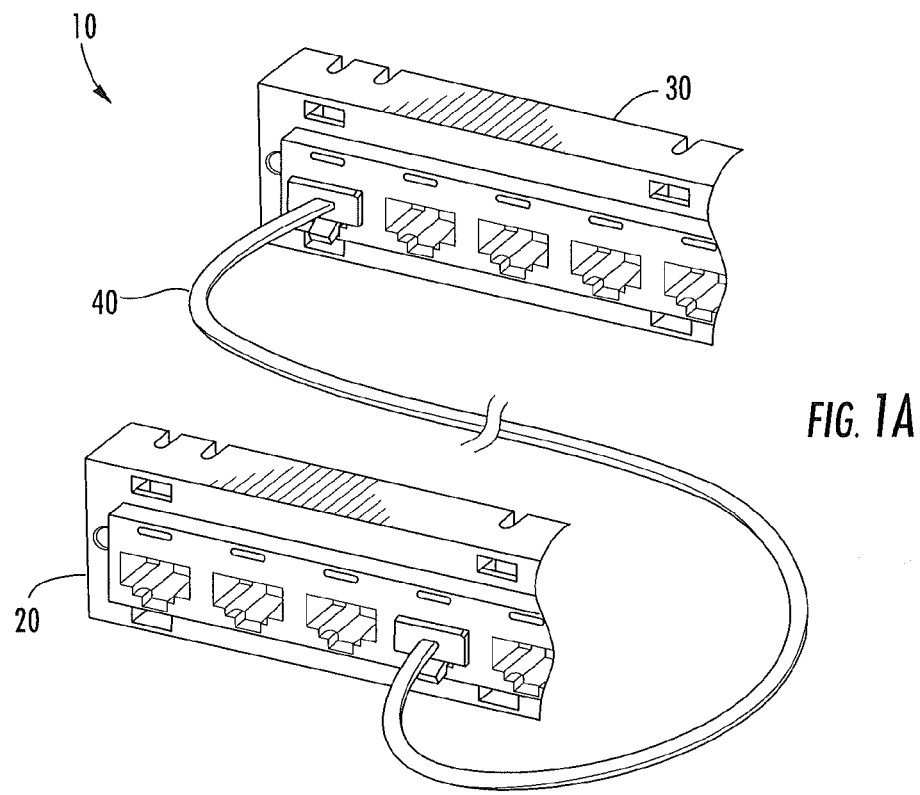
FIG. 1A is a schematic diagram illustrating a patching connection between an RJ-45 connector port on a first patch panel and an RJ-45 connector port on a second patch panel that may be automatically identified using the acoustic control signaling techniques according to embodiments of the present invention.
Figure 1B:
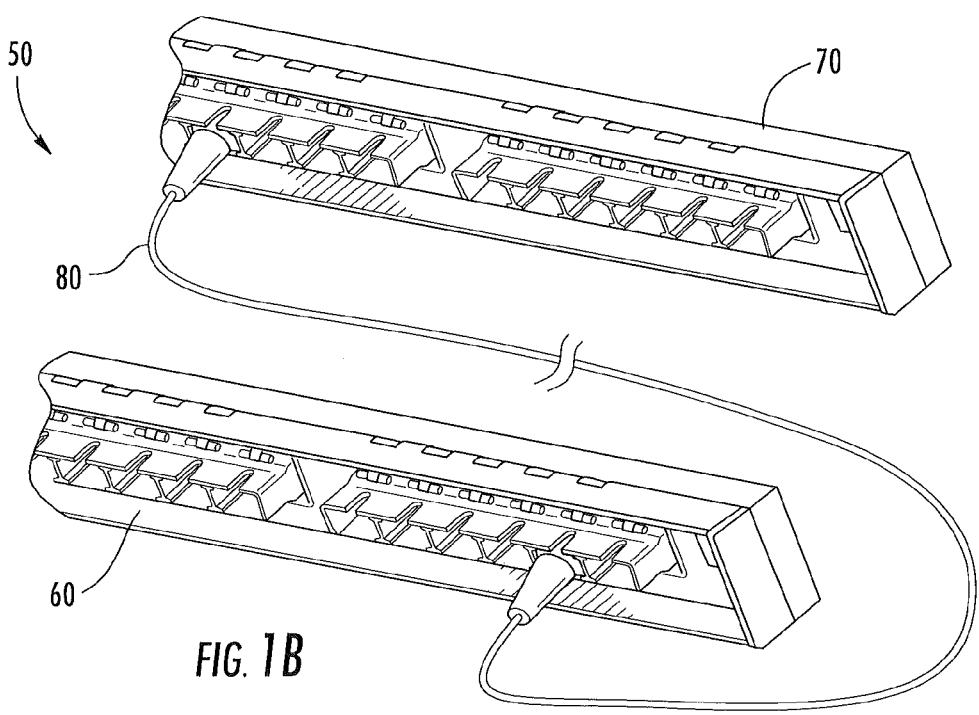
FIG. 1B is a schematic diagram illustrating a patching connection between a fiber optic adapter (connector port) on a first patch panel and a fiber optic adapter (connector port) on a second patch panel that may be automatically identified using the acoustic control signaling techniques according to embodiments of the present invention.

FIG. 1A illustrates a small portion of an exemplary communications system 10 that includes a first RJ-45 patch panel 20, a second RJ-45 patch panel 30 and a patch cord 40 that is used to interconnect one of the RJ-45 connector ports on the first patch panel 20 to one of the RJ-45 connector ports on the second patch panel 30. As discussed above, it may be desirable to configure the communications system 10 to automatically identify the specific RJ-45 connector ports on the patch panels 20, 30 that are connected by the patch cord 40. FIG. 1B illustrates a small portion of another exemplary communications system 50 that includes a first fiber optic patch panel 60, a second fiber optic patch panel 70 and a fiber optic patch cord 80 that is used to interconnect one of the fiber optic adapters on the first patch panel 60 to one of the fiber optic adapters on the second patch panel 70. It may likewise be desirable to configure the communications system 50 to automatically identify the specific fiber optic adapters on the patch panels 60, 70 that are connected by the fiber optic patch cord 80.

Pursuant to embodiments of the present invention, communications systems (and related equipment and methods) are provided that use acoustic control signals (including vibration signals) to automatically track patch cord and/or other cabling connections. The acoustic control signals may be carried over the cabling itself, and hence the cabling used in communication systems according to embodiments of the present invention need not (although they may) include extra conductors to provide a communications medium for the acoustic control signals that are used to track the patching/cabling connections. The techniques according to embodiments of the present invention may be used on a wide variety of communications cables, specifically including Ethernet communications cables (which are cables that include at least four twisted pairs of conductors) and fiber optic cables that include one or more optical fibers.

An acoustic signal refers to a mechanical wave that is an oscillation of pressure that is transmitted through a medium. Acoustic signals include vibrations, sound waves, ultrasound waves and infrasound waves. Acoustic signals that are at frequencies that are within the range of hearing (i.e., within the range of frequencies for which the sensation of hearing is stimulated in organs by the vibrations of the wave which, for humans, is about 20 Hz to 20 kHz) are typically referred to as sound waves or signals. Acoustic signals at higher frequencies (i.e., above about 20 kHz) are referred to as ultrasound waves or signals, and acoustic signals at very low frequencies (i.e., below about 20 Hz) are referred to as infrasound waves or signals. For purposes of this disclosure, the term "acoustic signal" encompasses all of the above-referenced mechanical waves, regardless of frequency. The term "acoustic signal," as used herein, also encompasses vibration signals such as a mechanical vibration back and forth about a central value that propagates along a transmission medium. The acoustic signals that are used in certain embodiments of the present invention may include information content embedded therein such as, for example, a unique identifier associated with a connector port.

Figure 2:
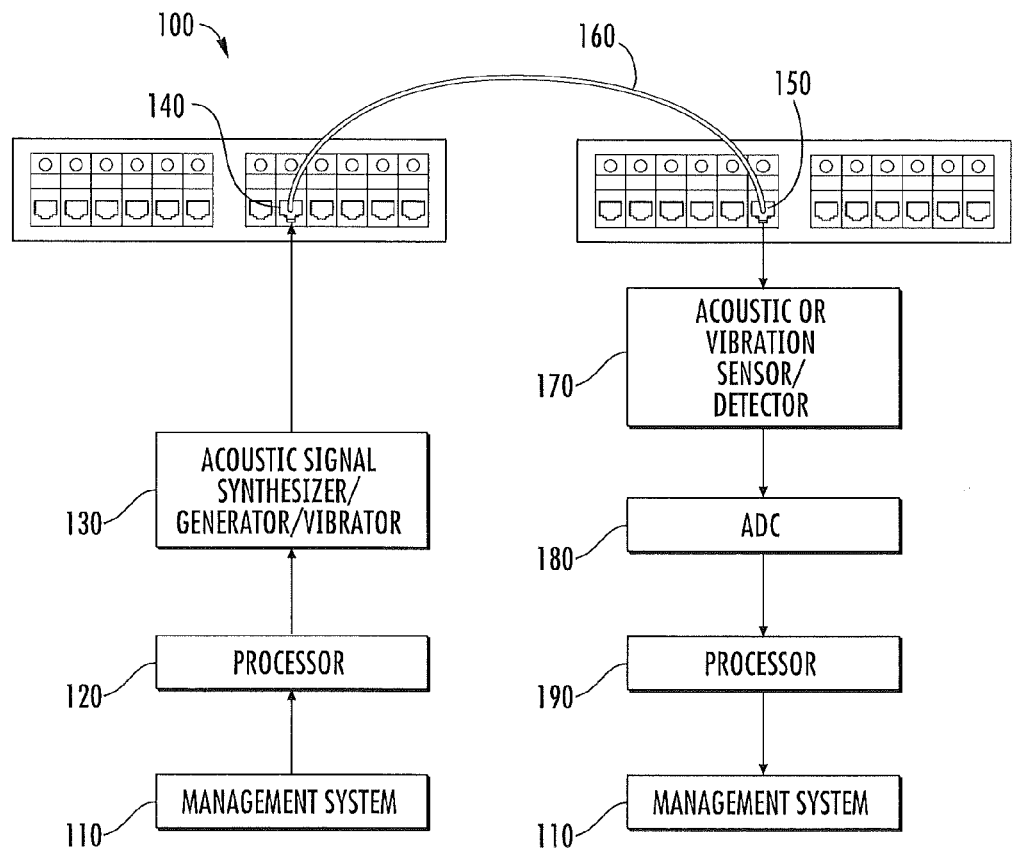
FIG. 2 is a block diagram of an intelligent patching system according to certain embodiments of the present invention.

FIG. 2 illustrates a communications system 100 according to embodiments of the present invention that uses acoustic control signals to automatically identify patching connections between patch panels of the communications system 100. As shown in FIG. 2, the communications system 100 includes a first connector port 140 that may be part of a first patch panel (not shown) and a second connector port 150 that may be part of a second patch panel (not shown). A patch cord 160 connects the first connector port 140 to the second connector port 150. The communications system further includes a management system 110, a first processor 120, an acoustic signal synthesizer/generator/vibrator 130 (referred to herein as an "acoustic signal generator"), an acoustic signal sensor/detector 170, an analog-to-digital convertor 180 and a second processor 190. In some embodiments, the first processor 120 may be mounted on the first patch panel and the second processor 190 may be mounted on the second patch panel. As is discussed in more detail herein, in some embodiments, a combined device may be provided on each patch panel that acts as both the acoustic signal generator 130 and as the acoustic signal detector 170. It will also be appreciated that the acoustic signal generator 130 and/or the acoustic signal detector 170 may be positioned within the connector ports 140, 150 in some embodiments or within a plug termination of a fiber optic patch cord that is received within the connector port.

The management system 110 may be a system that tracks patching connections throughout the communications system 100. The management system 110 may communicate with the processors (e.g., processors 120 and 190) that are included on (and/or used to control operations of) each patch panel in the communications system 100.

The processors 120 and/or 190 may control operations of the acoustic/vibration equipment that is used to generate the acoustic control signals that are used to track the patching connections in the communications system 100. The processors 120 and/or 190 may also pass the patching connections that are identified to the management system 110. The processors 120, 190 may comprise any appropriate processor, controller, microcontroller, application specific integrated circuit or other device that may control at least some of the operations of the intelligent patching system.

The acoustic signal generator 130 may be used to generate acoustic control signals. An acoustic control signal that is generated by the acoustic signal generator 130 is injected onto the patch cord 160 at or around the first connector port 140. The acoustic control signal travels over the patch cord 160 to the far end thereof, where it may be extracted from the patch cord 160 at or around the second connector port 150. The extracted acoustic control signal may be detected by an acoustic signal detector 170 that is located at or adjacent to the second connector port 150. The acoustic signal detector 170 generates an analog output signal in response to the received acoustic control signal, which is passed to the analog-to-digital ("A/D") converter 180. The A/D converter 180 converts the analog output signal into a digital signal that is passed to the processor 190.

Figure 3:
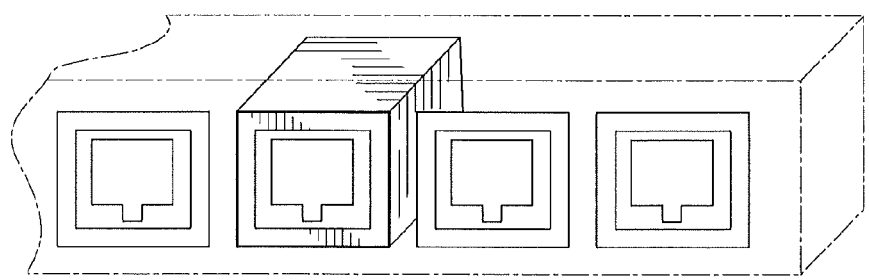
FIG. 3 is a schematic diagram illustrating a possible location on a patch panel for an acoustic signal generator according to embodiments of the present invention.

In some embodiments, the acoustic signal generator 130 may be located inside or adjacent to the first connector port 140. The acoustic signal detector 170 may likewise be located inside or adjacent to the second connector port 150. In some embodiments the acoustic signal generator 130 and/or the acoustic signal detector 170 may be mounted on the patch panels associated with the connector ports 140, 150, respectively. As shown in FIG. 3, in some embodiments, the acoustic signal generator 130 (or the acoustic signal detector 170) may surround all or part of its associated connector port (the shaded area in FIG. 3 illustrates the location of the acoustic signal generator 130 and/or the acoustic signal detector 170). This technique may be particularly effective when thin film acoustic signal generators and/or detectors are used. The acoustic signal generator could be mounted on the exterior of the connector port and transmit the acoustic signal through the connector port. In other embodiments, the acoustic signal generator could be mounted on an interior surface of the connector port and could apply the acoustic signal directly to the termination on the end of any patch cord that is plugged into the connector port. In some embodiments, a combined acoustic signal generator/detector may be associated with each patch panel connector port (e.g., connector ports 140, 150 in FIG. 2) of the communications system 100 that performs the functionality of both the acoustic signal generator 130 and the acoustic signal detector 170 in FIG. 2.

Various designs for the acoustic signal generator 130 are known in the art including, for example, discrete component designs and integrated circuit devices. For example, the acoustic signal generator 130 may comprise a piezoelectric device that includes a piezoelectric material. Piezoelectric materials are materials that produce electrical charges by the imposition of mechanical stress and which likewise produce mechanical stress in response to electrical charges. Accordingly, when an appropriate electrical field is applied to a piezoelectric material, it creates a mechanical stress. Piezoelectric acoustic wave generators apply an oscillating electric field to create a mechanical wave, which may propagate along a transmission path such as, for example, a patch cord, an optical fiber, a copper wire, a strength yarn, etc. The acoustic signal detector 170 may likewise include a piezoelectric material that converts this mechanical wave back into an electric signal.

Surface acoustic wave devices and bulk acoustic wave devices may be used to generate and/or detect acoustic signals. Additional examples of acoustic signal generators that may be used to implement acoustic signal generator 130 and/or acoustic signal detector 170 include thin film acoustic signal generators/detectors and micro electro-mechanical system ("MEMS") acoustic signal generators/detectors. For example, MEMS and thin film acoustic signal detectors have a characteristic propagation path that receives the acoustic signal. As the acoustic signal propagates on the surface of the thin film material, changes in the characteristics of the propagation path affect the velocity and/or amplitude of the mechanical wave. These changes in the velocity of the mechanical wave can be monitored by measuring the phase or frequency characteristics of the sensor and can then be correlated to the corresponding physical quantity that is being measured. It will also be appreciated that simpler acoustic signal generators 130 may also be used including, for example, a mechanical device such as a button, or any other appropriate device that may be used to generate an acoustic or vibration signal. In fact, in some embodiments, the acoustic signal generator 130 may also simply be the "click" noise or sound from the latch of a plug when a plug is inserted solidly within a connector port.

As will be discussed in further detail below, in some embodiments of the present invention, the acoustic control signal need not include data therein, and simply the presence of a received acoustic control signal at a connector port may be used to automatically track the patching connections in a communication system. In other embodiments, the acoustic control signal may have data contained therein such as, for example, an identifier associated with the connector port at which the acoustic control signal was injected onto the patch cord. In such embodiments, the acoustic signal generator 130 may, for example, generate an acoustic control signal that has data embedded therein, and the acoustic signal detector 170 may extract such data from received acoustic control signals.

As noted above, the acoustic control signals can be in the audible frequency range (i.e., sound waves) or non-audible frequency ranges (i.e., infrasonic and ultrasonic waves). The acoustic control signal can be a single frequency signal, a multiple frequency signal, or a series of specially designed acoustic control signals. As noted above, the acoustic control signals include forms of vibrations.

The acoustic control signal will propagate along the patch cord 160. The portion of the patch cord 160 that primarily serves as a propagation medium for the acoustic control signal may differ depending upon the type of cordage used and how and where the acoustic control signal is injected onto the patch cord. For example, in some embodiments, the cable jacket of the patch cord 160 may serve as the primary transmission path for the acoustic control signal. In other embodiments, insulated conductive wires and or optical fibers that are within the cable jacket may alternatively and/or additionally serve as the primary transmission path for the acoustic control signal. In some embodiments, the acoustic control signal may be injected onto the outer surface of the patch cord 160, while in other embodiments, the acoustic control signal may be injected onto specific components within the interior of the patch cord 160. In still other embodiments, the acoustic control signal may be injected through a connector port (or portions thereof) and/or through a patch cord termination (or portions thereof) onto the cabling of the patch cord 160 or component(s) thereof.

Ethernet cables tend to be somewhat rigid cables which can be suitable media for propagating acoustic control signals. Fiber optic cables, in contrast, tend to exhibit less rigidity (i.e., they are more flexible). Embodiments of the present invention may work with both rigid and/or more flexible cordages. In some embodiments, when more flexible cabling is used, special frequencies and/or specially designed sequences of acoustic control signals may be employed that may have enhanced propagation properties on these more flexible materials. The system can be designed to have the ability to recognize the desired acoustic control signals from ambient noise and from acoustic control signals that are carried on neighboring patch cords.

In some embodiments, polling techniques may be used to discover the patching connections. By way of example, the management system 110 may cause the processor 120 on the patch panel that includes connector port 140 to instruct the acoustic signal generator 130 to generate an acoustic control signal that is injected onto the patch cord 160. The processor 120 also notifies the system manager 110 that an acoustic control signal is being transmitted from the connector port 140. After such an acoustic control signal is transmitted, the processors on each of the patch panels in the communications system 100 (e.g., processors 120 and 190 in the simple communications system of FIG. 2) will "listen" to determine if the acoustic control signal was received at any of their connector ports. If the acoustic control signal is received at a particular connector port (e.g., connector port 150), then the processor 190 on the patch panel that includes the connector port 150 passes the identifier of the connector port 150 to the management system 110, so that the connection between connector port 140 and connector port 150 may be logged in a connectivity database. If no connector port in the communications system 100 receives the acoustic control signal within a predetermined time period, then the management system 110 assumes that connector port 140 is not attached to any other connector port by a patch cord.

The management system 110 may serially cause an acoustic control signal to be transmitted from each connector port in the communications system 100 in order to automatically identify the patch cord connections between the patch panel connector ports that are included in the communications system 100. It will also be appreciated that various techniques may be used to reduce the number of acoustic control signals that need to be transmitted to discover the patch cord connections such as, for example, not transmitting acoustic control signals from any connector port that has already been identified as being connected by a patch cord to another connector port. Additionally, in some embodiments, plug insertion/removal sensors may be provided at each connector port in the communications system 100 that may be used to detect each time a patch cord termination (e.g., a plug) is inserted into and/or removed from a connector port in the communications system 100. In such embodiments, acoustic control signals may only be transmitted from a connector port when it is detected that a plug has been inserted into the connector port. If this approach is used, the system may be designed to only transmit acoustic control signals in response to detecting that a plug has been inserted into a connector port of the communications systems instead of sending out acoustic control signals on a periodic (or aperiodic) basis. A combination of these approaches may also be used.

In other embodiments, information such as, for example, a unique identifier may be embedded in each acoustic control signal that is transmitted. The unique identifier may be associated with the connector port from which the acoustic control signal is transmitted, and this unique identifier may be used by the processor that is connected to the connector port that receives the acoustic control signal to identify the patching connection between the two connector ports. The unique identifier may be embedded in the acoustic control signal in a variety of ways including, for example, by varying one or more characteristics of the acoustic control signal such as the frequency of the mechanical wave, the amplitude of the mechanical wave, the duration of the signal, etc. The acoustic control signal may also be implemented as a series of discrete acoustic signals with time intervals therebetween. The tone of discrete signals (frequencies), the amplitude of the discrete signals, the duration of the discrete signals and/or the time intervals between adjacent (and/or non-adjacent) of the discrete signals can be programmed by the processor 120. By varying, for example, the above-mentioned parameters of the series of discrete acoustic signals, the processor 120 may encode the unique identifier into the acoustic signal (or a portion thereof). The acoustic signal detector 170 at the receiving connector port 150 can detect the above-referenced parameters of the acoustic signal (e.g., frequency, amplitude, duration, etc.) and the processor 190 that is associated with the connector port 150 may extract the unique identifier based on the decoded parameters of the received acoustic signal, and thus recognize the identity of the connector port that transmitted the acoustic signal. By varying one or more of the above-mentioned parameters, different unique identifiers may be provided that may be associated with each connector port in the communications system 100.

In some cases, an acoustic control signal that is generated at one connector port may be partially received on a patch cord at another (e.g., adjacent) connector port. In order to reduce the possibility of this occurring, steps may be taken to dampen the conduction of acoustic signals along the patch panel and/or along the outer surface of the patch cords. The processor on each patch panel may also require a minimum amplitude for any received acoustic control signal in order to prevent the occurrence of "false positives" that might otherwise arise due to crosstalk where an acoustic control signal that is transmitted on one patch cord couples to one or more additional patch cords in the communications system. Alternatively, the processor(s) on the patch panels may select the connector port at which the acoustic signal having the highest received signal strength was received as the connector port that is connected to the connector port that transmitted the acoustic control signal in order to reduce the possibility of the above-mentioned "false positive" detections.

In some embodiments, each connector port on a patch panel may include its own acoustic signal generator 130. However, in other embodiments, it may be possible to include a single acoustic signal generator 130 on a patch panel that is coupled to all of the connector ports on the patch panel. In such embodiments, a switch, multiplexer or the like may be provided that selectively couples the acoustic control signals to the appropriate connector ports on the patch panel.

Figure 4:
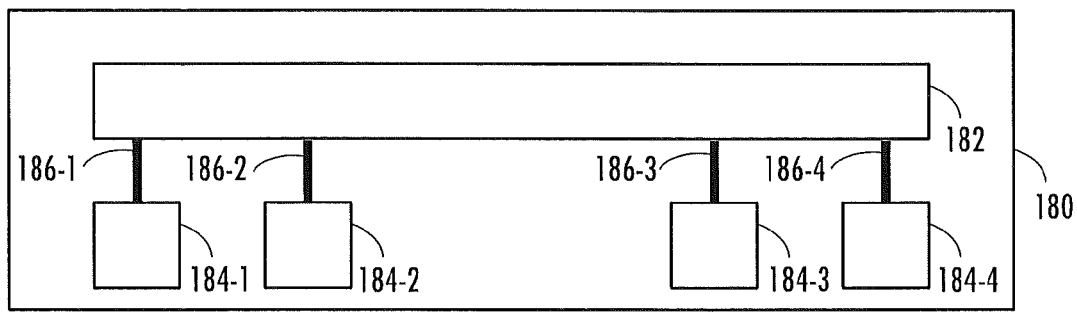
FIG. 4 is a schematic block diagram of a patch panel that includes an acoustic signal generator according to certain embodiments of the present invention that is multiplexed to send acoustic control signals over multiple connector ports.

By way of example, FIG. 4 is a schematic block diagram of a patch panel 180 that includes an acoustic signal generator 182 and a plurality of connector ports 184-1 through 184-4. A plurality of acoustic signal propagation paths 186-1 through 186-4 are provided that couple an acoustic control signal that is generated by the acoustic signal generator 182 to each of the respective connector ports 184-1 through 184-4. The acoustic signal propagation paths 186-1 through 186-4 effectively extend the "output" of the acoustic signal generator 182 to each of the connector ports 184-1 through 184-4. Each acoustic signal propagation path 186-1 through 186-4 may comprise a rigid material that efficiently propagates acoustic signals within a respective one of four frequency bands, while significantly attenuating acoustic signals that are in the other three frequency bands, where each propagation path 186-1 through 186-4 is configured to efficiently propagate acoustic signals that are in a different one of the four frequency bands. The acoustic signal generator 182 may be designed to generate acoustic signals that are in any of the four frequency bands. In order to transmit an acoustic signal into, for example, a patch cord that is plugged into connector port 184-2, the acoustic signal generator 182 would generate an acoustic signal that is in the frequency band that is efficiently propagated by acoustic signal propagation path 186-2, and this acoustic signal would be output by the acoustic signal generator 182 to all four acoustic signal propagation paths 186-1 through 186-4. The acoustic signal would be substantially attenuated by propagation paths 186-1, 186-3 and 186-4, and hence the acoustic signal would only be transmitted (at least at amplitude levels that are large enough to be detected by the acoustic signal detectors at connector ports on the far end of the patch cord connections) over the patch cord (if any) that is inserted into connector port 184-2.

While the system discussed above with respect to FIG. 4 illustrates one method of selectively coupling acoustic control signals from a shared acoustic signal generator 182 to a selected one of a plurality of connector ports 184-1 through 184-4, it will be appreciated that other switching, multiplexing or selective transmission techniques may be used.

It will be appreciated that, in some cases, active electronic equipment such as network switches, routers, servers and the like may be mounted on the same equipment racks on which the patch panels of communications system 100 are mounted. This electronic equipment may generate vibrations or other acoustic signals that may propagate across patch cords and be received at other connector ports. The use of acoustic control signals that include unique identifiers may be used in some embodiments in order to reduce or prevent the occurrence of "false positives" from such extraneous acoustic signals.

In some embodiments, the system may be calibrated in order to identify frequencies for the acoustic control signals that propagate well on the particular patch cords that are used with the communications system. In some embodiments, the system could perform a self-calibration operation to identify the frequencies to use. In other embodiments, the acoustic signal generators could transmit multiple acoustic signals at different frequencies each time an acoustic control signal is transmitted in order to ensure that an acoustic control signal is transmitted at a frequency that will propagate well (i.e., with relatively low loss) along any patch cord that is plugged into the connector port at issue.

Figure 5A:
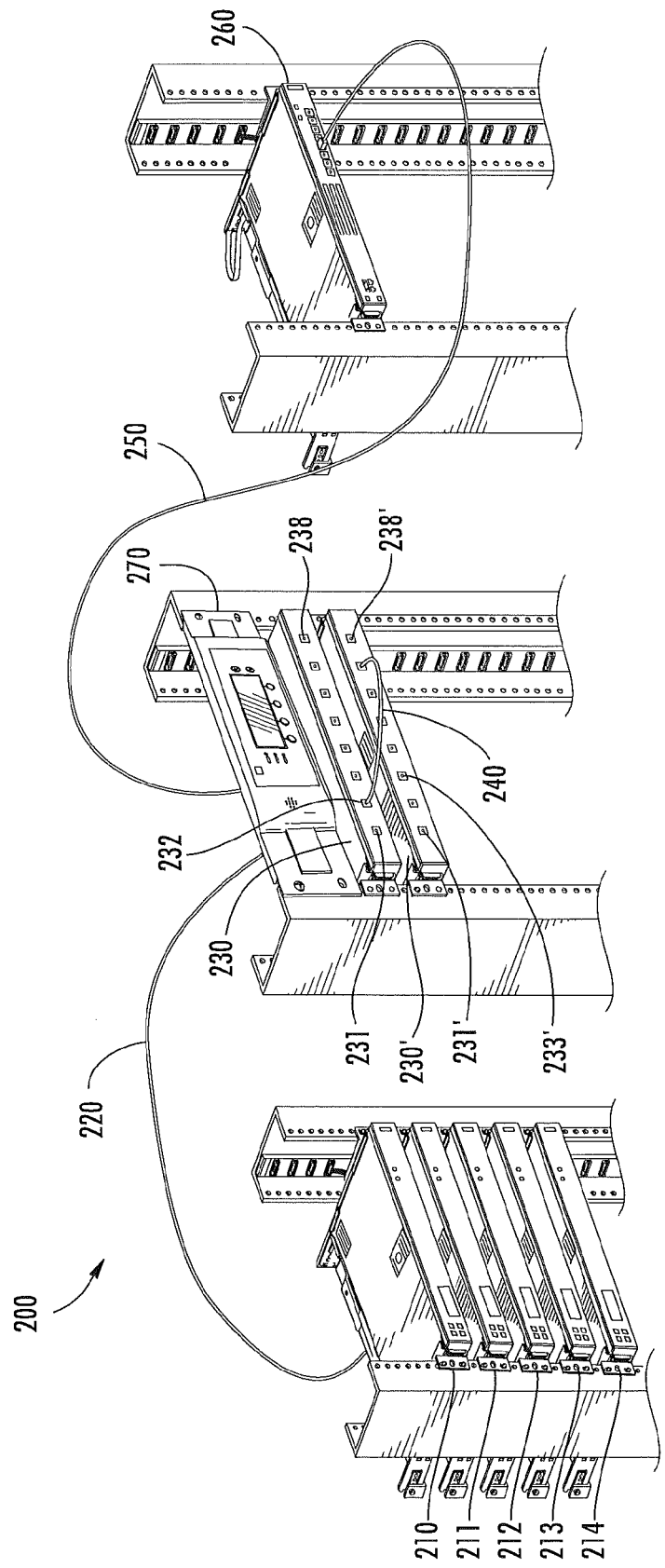
FIG. 5A is a schematic diagram of an intelligent patching system that uses acoustic control signals according to further embodiments of the present invention.
Figure 5B:
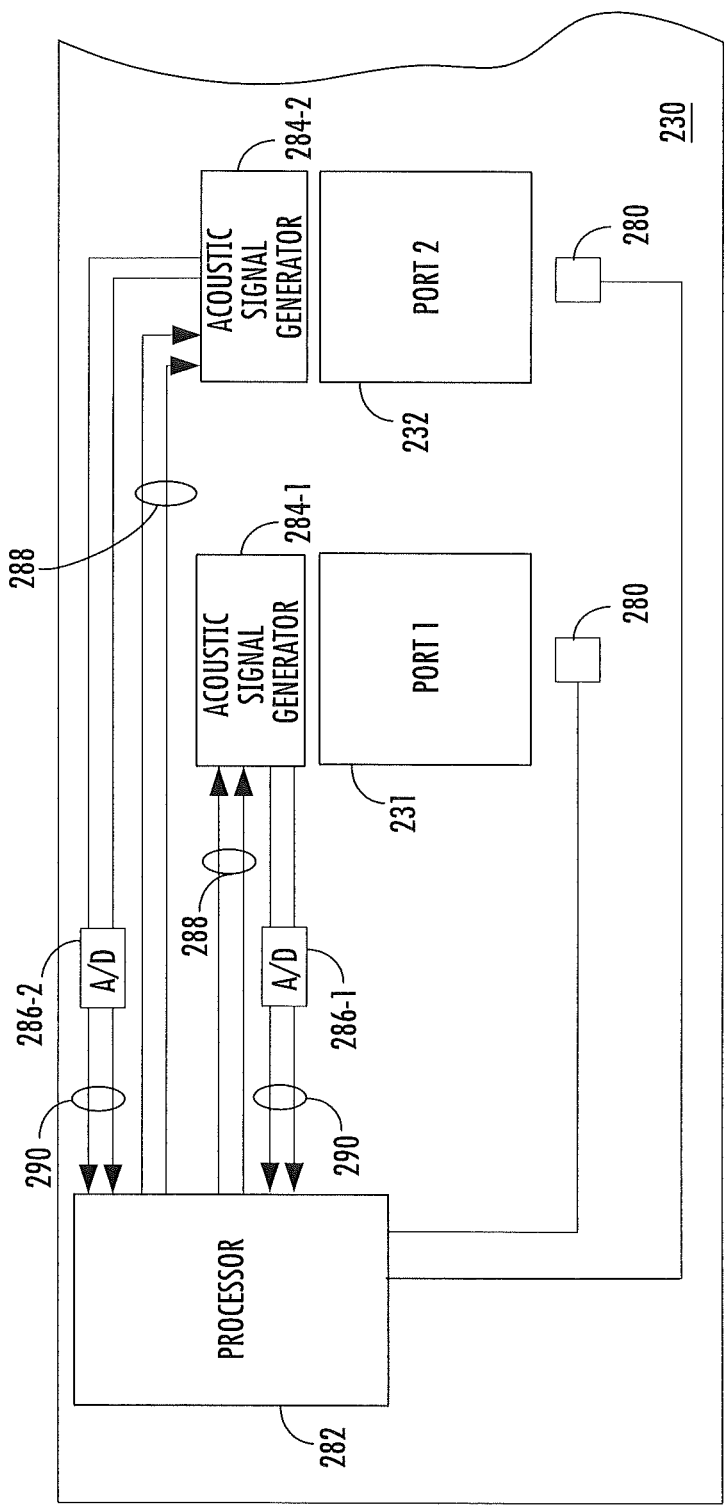
FIG. 5B is a block diagram of one of the patch panels included in the intelligent patching system of FIG. 5A

FIG. 5A is a schematic diagram of a highly simplified intelligent fiber optic patching system 200 according to embodiments of the present invention that uses acoustic control signals. FIG. 5B is a block diagram of one of the patch panels 230, 230' of FIG. 5A.

As shown in FIG. 5A, a plurality of rack-mounted servers 210-214 are connected by individual cables 220 such as fiber optic patch cords (only one fiber optic patch cord 220 is shown in FIG. 5A to simplify the drawing) to a rack-mounted patch panel 230. The patch panel 230 may be any suitable fiber optic patch panel that includes a plurality of fiber optic connectors 231-238 such as, for example, SC, LC and/or Multi-fiber Push On ("MPO") connectors. Cable 220 is plugged into the backside (which is not visible) of connector port 232 on patch panel 230. A second rack-mounted patch panel 230' is also provided that includes a plurality of fiber optic connectors 231'-238' (only some of the connector ports 231-238 and 231'-238' are numbered in FIG. 5A to simplify the drawing). A plurality of fiber optic cables 250 are provided (again, only one fiber optic cable 250 is shown in FIG. 5A to simplify the drawing) that connect the backside of various of the connector ports 231'-238' on the second patch panel 230' to respective ones of a plurality of connector ports on a network switch 260. A plurality of fiber optic cables 240 (again only one fiber optic cable 240 is shown in FIG. 5A to simplify the drawing) are provided that extend between the connector ports 231-238 on patch panel 230 and connector ports 231'-238' on patch panel 230'. In order to change the connectivity between the servers 210-214 and the network switch 260, a technician may rearrange the patch cords 240 in order to change the connections between the connector ports 231-238 and connector ports 231'-238'.

As is further shown in FIG. 5A, a rack manager 270 is provided, for example, on the same equipment rack as the patch panels 230, 230'. The rack manager 270 may be in communication with processors that may be provided on patch panels 230, 230'. A system administrator computer (not shown) may also be provided that is in communication with the rack manager 270. The rack manager 270 and/or the system administrator computer may control operations of the intelligent patching system 200 so that the connections of the patch cords 240 between connector ports 231-238 and connector ports 231'-238' are automatically logged in a database that is maintained, for example, at the system administrator computer and/or the rack manager 270.

FIG. 5B is a schematic block diagram that illustrates various of the components that are included on one example embodiment of the fiber optic patch panel 230. The fiber optic patch panel 230' may be identical to the fiber optic patch panel 230, and hence will not be discussed further herein.

As shown in FIG. 5B, the fiber optic patch panel 230 includes a plurality of connector ports 231-238 (only connector ports 231 and 232 are visible in FIG. 5B). Each of the connector ports 231-238 may (optionally) include a plug insertion/removal sensor 280. These plug insertion/removal sensors 280 are configured to detect each time a fiber optic patch cord is inserted into, or removed from, the front side of the respective one of the connector ports 231-238 that the plug insertion/removal sensor 280 is associated with. The plug insertion/removal sensors 280 may be implemented using, for example, mechanical sensors, optical sensors, electrical sensors, magnetic sensors, wireless technology (e.g., RFID tags, serial ID tags, etc.) or any other technology that may be used to detect when a plug is inserted into, or removed from, one of the connector ports 231-238. The plug insertion/removal sensors 280 may be omitted in some embodiments.

The patch panel 230 further includes a processor 282, a plurality of acoustic signal generator/detectors 284-1 through 284-8 (only acoustic signal generator/detectors 284-1 and 284-2 are visible in FIG. 5B), and a plurality of A/D converters 286-1 through 286-8 (only A/D converters 286-1 and 286-2 are visible in FIG. 5B). The acoustic signal generator/detectors 284-1 through 284-8 may be, for example, piezoelectric devices that are configured to generate acoustic control signals having a predetermined frequency in response to electrical control signals that are received from the processor 282. Each such piezoelectric acoustic signal generator/detector 284-1 through 284-8 may also be configured to generate an electrical control signal in response to a received acoustic control signal. Piezoelectric acoustic signal generators and detectors are known in the art, and hence further description thereof will be omitted. It will likewise be appreciated that the acoustic signal generator/detectors 284-1 through 284-8 may be implemented using other suitable technologies including thin film and MEMS technology, electromagnetic technology and electrostatic technology. It will also be appreciated that the acoustic signal generator/detectors 284-1 through 284-8 may be implemented as two separate devices: namely, a first device that is configured to generate acoustic control signals and a second device that is configured to detect acoustic control signals.

As is further shown in FIG. 5B, the processor 282 is in communication with the acoustic signal generator/detectors 284-1 through 284-8 via respective first and second pairs of conductive lines 288 and 290. The analog-to-digital converters 286-1 through 286-8 are interposed on the pair of conductive lines 290 in order to convert analog electrical signals that are output by the acoustic signal generator/detectors 284-1 through 284-8 into digital signals that are input to the processor 282. Each of the plug insertion/removal sensors 280 is also electrically connected to the processor 282. In some embodiments, each plug insertion/removal sensor 280 may continuously transmit a control signal to the processor 282, with a voltage level of the control signal indicating either the presence (e.g., a high voltage level) or absence (e.g., a low voltage level) of a plug in the connector port 231-238 with which each plug insertion/removal sensor 280 is associated.

Figure 5C:
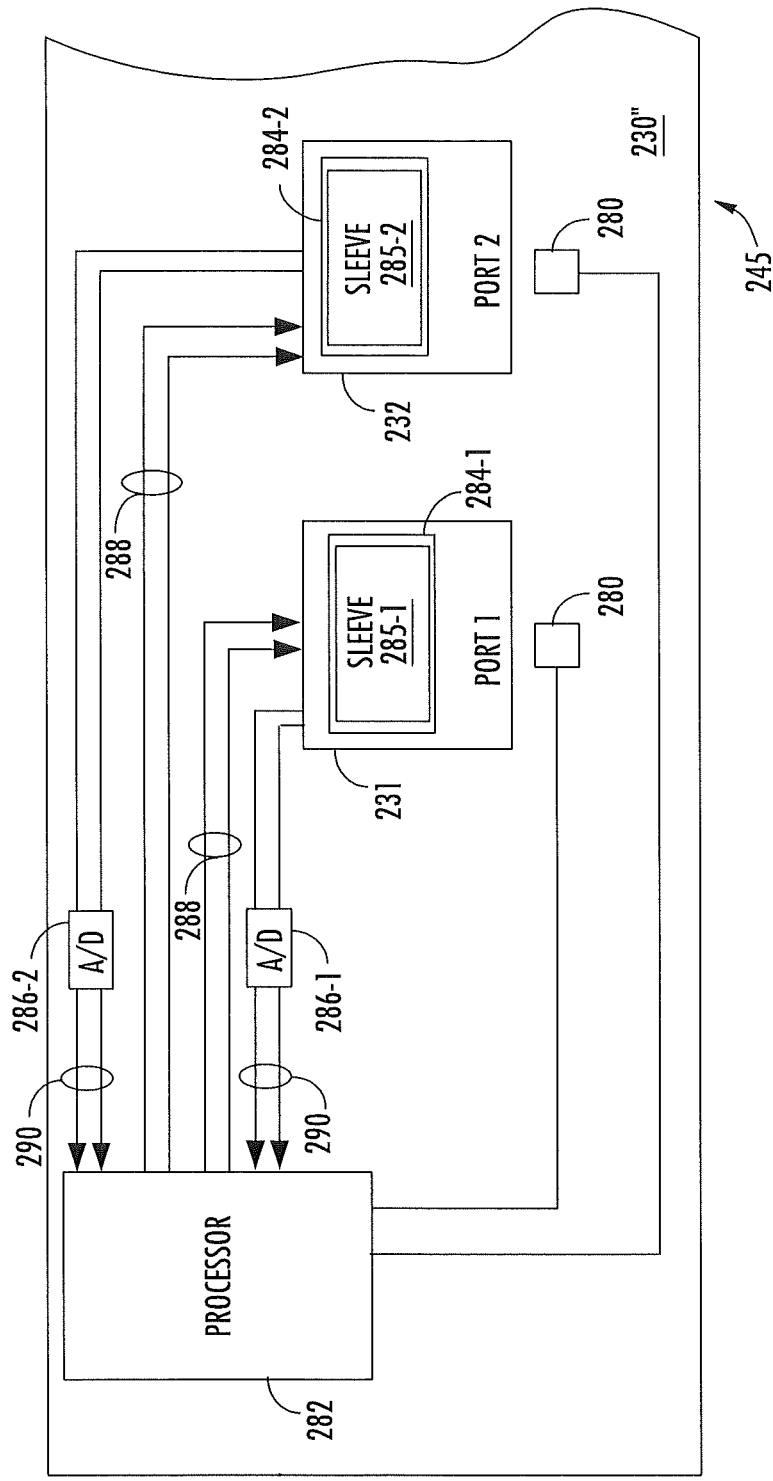
FIG. 5C is a block diagram of another patch panel that may be used in the intelligent patching system of FIG. 5A

In the embodiment of FIGS. 5A-5B that is discussed above, each acoustic signal generator/detector 284-1 through 284-8 is located adjacent to a respective one of the connector ports 231-238. As will be clear from the discussion below, in other embodiments such as the embodiment depicted in FIG. 5C, each acoustic signal generator/detector 284-1 through 284-8 may be located partially or completely within its associated connector port 231-238. By way of example, as shown in FIG. 5C, in further embodiments of the present invention patch panels 230" may be provided that include connector ports 231"-238". Each connector port 231"-238" may comprise a fiber optic adapter that includes a respective split sleeve 285-1 through 285-8. Each split sleeve 285-1 through 285-8 is designed to receive the ferrules of fiber optic patch cords that are received by the fiber optic adapter. Each acoustic signal generator/detector 284-1 through 284-8 may be positioned within its respective connector port 231"-238" to at least partially surround the respective split sleeve 285-1 through 285-8 that is mounted therein. As the polymer layer on the optical fiber is typically removed with respect to the portion of the optical fiber that is inserted within the ferrules on the plug termination of the fiber optic patch cords 220, 240 and each optical fiber is bonded to its respective ferrule, the acoustic signal generator/detector (e.g., acoustic signal generator/detector 284-1) can inject the acoustic control signals through the split sleeve 285-1 and the ferrule (not shown) directly onto the silica cladding layer of the optical fiber. In still other embodiments, the split sleeve (e.g., split sleeve 285-1) itself may comprise the acoustic signal generator/detector by, for example, constructing all or part of the split sleeve 285-1 using a piezoelectric material.

While in the embodiments of FIGS. 5A-5C the acoustic signal generator/detectors are part of the patch panel, it will be appreciated that in further embodiments of the present invention the acoustic signal generators and/or the acoustic signal detectors may alternatively be located in the plug terminations that are included on the ends of the patch cords 220, 240. The processor on the patch panel may be in electrical communication with the acoustic signal generators and acoustic signal detectors when the patch cords are plugged into connector ports on the patch panel in order to cause each acoustic signal generator to inject acoustic control signals, as appropriate, onto an optical fiber within the patch cord on which it is mounted and to receive acoustic control signals from the acoustic signal detectors.

Figure 5D:
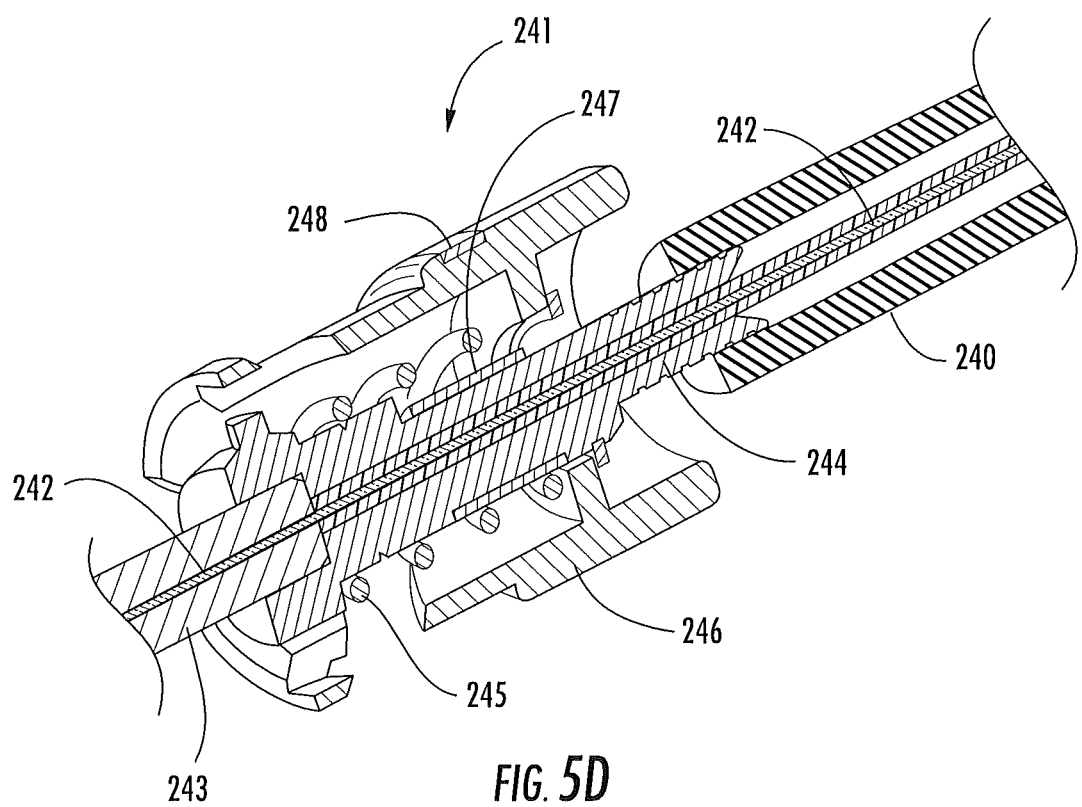
FIG. 5D is a partially cut-away schematic perspective diagram of a fiber optic patch cord termination according to embodiments of the present invention that includes an acoustic signal generator/detector.

FIG. 5D is a partially cut-away schematic perspective diagram that illustrates an end of fiber optic patch cord 240 that includes a plug termination 241. As shown in FIG. 5D, the plug termination 241 includes an optical fiber 242, a ferrule 243, a ferrule holder (which is often referred to as a "ferrule barrel") 244, a spring 245 and a housing 246. As noted above, the portion of the optical fiber 242 that is received within the ferrule 243 typically has the polymer layer removed, and the optical fiber 242 is bonded within the ferrule 243 using, for example, a thin coating of epoxy (not shown). The ferrule 243 is typically formed as an elongated metal or ceramic cylinder having open ends. The ferrule 243 is securely press fit into the ferrule barrel 244, which also is typically formed of a metal such as brass or from a ceramic material. The spring 245 is used to mount the ferrule barrel 244 under an axial spring force within the connector housing 246 so that the ferrule barrel 244 (and hence the ferrule 243 therein) floats within the connector housing 246. This floating arrangement is provided to ensure that the two mating plug terminations 241 that are received within the fiber optic connector port are properly optically aligned.

As shown in FIG. 5D, in some embodiments, an acoustic signal generator/detector 247 may be mounted within the plug termination 241. In the depicted embodiment, the acoustic signal generator/detector 247 is mounted on an outside surface of the ferrule barrel 244 so as to at least partially surround the ferrule barrel 244. The acoustic signal generator/detector 247 may be implemented, for example, by wrapping a piezoelectric material around the ferrule barrel 244. One or more contacts 248 may be provided on an outside surface of the housing 246. These contacts 248 may be electrically connected by conductive paths (not shown) to the acoustic signal generator/detector 247. Mating contacts (not shown) may also be included inside the connector ports on a patch panel that receives the termination 241 of patch cord 240. When the plug termination 241 is received within a connector port on the patch panel, a processor on the patch panel may send an electrical control signal to the acoustic signal generator 247 via the contact within the connector port and the mating contact 248. In response to this control signal, the acoustic signal generator/detector 247 may generate an acoustic control signal that is injected through the ferrule barrel 244 and the ferrule 243 onto the optical fiber 242. Likewise, acoustic control signals that are transmitted from the far end of the patch cord 240 along the optical fiber 242 may be received by the acoustic signal generator/detector 247 through the ferrule 243 and the ferrule barrel 244, where they are converted into electrical signals that are passed to the processor on the patch panel via the contact 248 and the mating contact in the patch panel connector port. Thus, FIG. 5D illustrates one example embodiment where the acoustic signal generator/detector 247 may be mounted in the plug terminations on the fiber optic patch cords instead of on the patch panel.

According to still further embodiments of the present invention, the ferrule barrel 244 may be formed using a piezoelectric material or may include a piezoelectric material such that the ferrule barrel 244 may itself act as the acoustic signal generator/detector. In such embodiments, the acoustic signal generator/detector 247 that is illustrated in FIG. 5D may be omitted, and the contacts 248 may be electrically connected to the ferrule barrel 244 in order to cause the ferrule barrel to generate acoustic control signals and/or to couple electrical signals that are generated when the combined ferrule barrel/acoustic signal generator/detector 244 receives an acoustic control signal. In each of the above cases, the ferrule 243 (and ferrule barrel 244 in some cases) may be formed of an acoustically active material so that the acoustic control signal may pass through the ferrule 243 and/or the ferrule barrel 244 when passing from the acoustic signal generator/detector 247 to the optical fiber 242 and vice versa. As noted above, the portion of the optical fiber 242 that is received within the ferrule 243 will typically not include a polymer layer so that the acoustic control signal may be injected directly onto (or extracted from, in the case of acoustic detection) the cladding of the optical fiber 242.

As noted above, in some embodiments, the acoustic control signals may be injected onto (and extracted from) an optical fiber through a ferrule, a ferrule barrel and/or other components of the connector port and/or the plug termination on the patch cord. As discussed in more detail herein, in some embodiments, the ferrule and/or other components may comprise "acoustically active" components, meaning that the component(s) are designed to efficiently transmit acoustic signals within at least some frequency ranges that are received on an outer surface thereof. Herein a component that is referred to as being an "ultrasonically active" component means that the component is designed to efficiently transmit acoustic signals within at least some frequency ranges within the ultrasonic frequency band. As discussed above, in some embodiments, the acoustic signal generator/detectors may be positioned directly adjacent to the ferrules or other components that may be included in its associated connector ports and, in some embodiments, may be in direct contact with an outside surface of the ferrule or other components in order to inject acoustic signals through the components with low loss, and to likewise receive acoustic signals from the components with low loss.

In other embodiments, the plug terminations may have ferrules that include one or more openings therethrough that expose one or more optical fibers that are contained therein. In these embodiments, the acoustic signal generator/detectors may be configured to directly inject a generated acoustic signal onto the optical fibers through such an opening in order to avoid any loss that might otherwise occur if the acoustic signal is transmitted through the ferrule. It will be appreciated that the acoustic signals may be coupled onto an optical fiber in other ways such as, for example, at other points within the fiber optic connector port. It will likewise be appreciated that the acoustic control signal from each of the acoustic signal generator/detectors may inject the acoustic control signals onto other portions of a fiber optic cable other than an optical fiber (i.e., onto a strength member, onto a cable jacket, onto a specially provided acoustic signal propagation medium provided within the cable, etc.).

Figure 6:
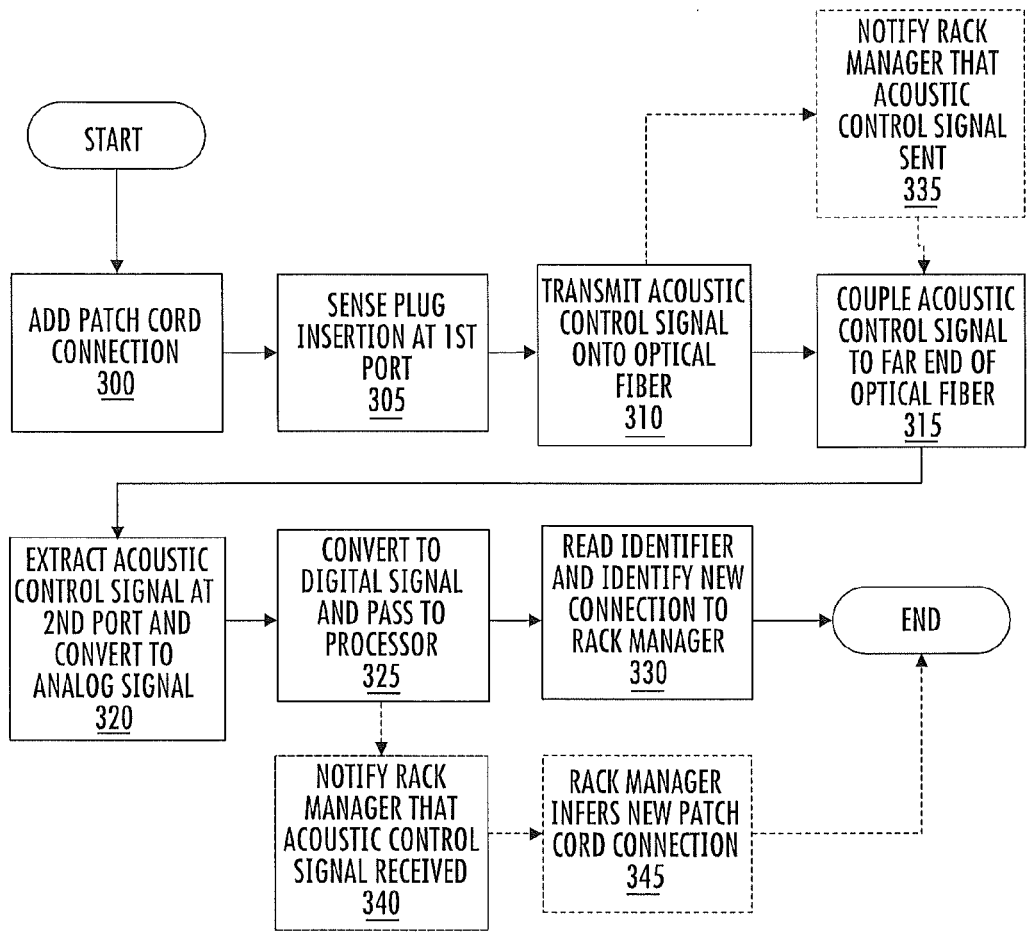
FIG. 6 is a flow chart illustrating methods of identifying patching connections using acoustic control signals according to embodiments of the present invention.

Examples of ways in which the intelligent patching system 200 may be operated will now be described with reference to FIGS. 5A and 5B and the flow chart of FIG. 6. As shown in FIG. 6, operations may begin with a fiber optic patch cord 240 being coupled between a connector port (e.g., connector port 232) on the first fiber optic patch panel 230 and a connector port (e.g., connector port 236') on the second fiber optic patch panel 230' (block 300). A plug insertion/removal sensor 280 that is associated with the connector port 232 senses the insertion of the fiber optic patch cord 240 into connector port 232, and sends a control signal to the processor 282 on patch panel 230 that indicates that this plug insertion has occurred (block 305). Note that in some embodiments the acoustic signal generator/detector 284-2 that is associated with connector port 232 may sense the simple click that will occur when the latch on the plug of fiber optic patch cord 240 snaps into place as the plug is inserted into connector port 232. Thus, in some embodiments, the acoustic signal generator/detector 284-2 may be configured to also act as a plug insertion/removal sensor 280.

In response to the plug insertion control signal, the processor 282 sends a signal to the acoustic signal generator/detector 284-2 that is associated with connector port 232, which causes the acoustic signal generator/detector 284-2 to generate an acoustic control signal, which acoustic control signal is injected at the connector port 232 onto an optical fiber that is included in the patch cord 240 (block 310).

In embodiments in which the acoustic control signal includes a unique identifier embedded therein that identifies the connector port at which the acoustic control signal was injected onto the optical fiber (i.e., connector port 232 of patch panel 230 in this example), as shown in FIG. 6, operations may continue with acoustic control signal coupling through the optical fiber to connector port 236' on patch panel 230' (block 315). The acoustic signal generator/detector 284-6' associated with connector port 236' detects the acoustic control signal, and converts the acoustic control signal into an analog electrical signal (block 320). This analog signal is fed into an analog-to-digital converter 290 where it is converted into a digital control signal that is provided to the processor 282 on patch panel 230' (block 325). The processor 282 reads the unique identifier of connector port 232 on patch panel 230 from the control signal and then notifies the rack manager 270 that a new patch cord connection has been identified that extends between connector port 232 on patch panel 230 and connector port 236' on patch panel 230' (block 330). In this fashion, the intelligent patching system 200 may use acoustic control signals to automatically track patching connections.

As shown by the blocks in FIG. 6 that are drawn with dotted lines, in embodiments in which the acoustic control signal does not include embedded information that identifies the connector port 232 at which the acoustic control signal was injected onto the optical fiber, the processor 282 on patch panel 230 notifies the rack manager 270 when it sends the control signal to acoustic signal generator/detector 284-2 (block 335). This notification of block 335 may alternatively be sent either before or after the acoustic control signal is transmitted at block 310 (i.e., the rack manager 270 might be notified after the plug insertion is sensed at the first connector port 232 but before transmission of the acoustic control signal so that the second patch panel 230' may be waiting for receipt of the acoustic control signal). When the processor 282 on patch panel 230' receives the control signal from acoustic signal generator/detector 284-6' at block 325, it simply notifies the rack manager 270 to this effect (block 340) instead of performing the operations of block 330 (as the rack manager 270 does not know which connector port the acoustic signal was sent from). The rack manager then makes a "logical inference" based on the back-to-back receipt of the notifications sent at blocks 335 and 340 that a new patch cord connection has been installed between connector ports 232 and 236' (block 345).

While FIG. 6 illustrates operations that may be carried out in certain embodiments of the present invention, it will be that understood that in other embodiments the operations identified in certain blocks of the flowchart of FIG. 6 may be carried out in a different order than is shown in FIG. 6 and/or the operations of two blocks in the flowchart may be carried out substantially simultaneously. It will also be understood that in some embodiments of the present invention the operations identified in some of the blocks in the flowchart of FIG. 6 may be omitted.

The intelligent patching system 200 may use the plug insertion/removal sensors 280 to detect the removal of patch cords, as these sensors 280 will notify the processors 282 on their respective patch panels 230, 230' each time an end of a fiber optic patch cord is removed from the connector ports thereon. Upon being notified of such plug removals, the rack manager 270 may delete the patch cord connection associated with the connector ports at issue from the database.

While the embodiments described with respect to FIGS. 5 and 6 include plug insertion/removal sensors 280, it will be appreciated that these sensors 280 may be omitted in other embodiments. In such embodiments, the intelligent patching system may, for example, periodically transmit acoustic control signals serially to every connector port for injection onto any patch cord inserted therein in order to map the patch cord connections.

As discussed above, in some embodiments of the present invention that use fiber optic patch panels and patch cords, the acoustic control signals may be injected onto one (or more) of the optical fibers that are within the patch cord so that the optical fiber will serve as the primary propagation medium for the acoustical control signal. The optical fiber as opposed to other portions of the cable (e.g., the cable jacket) may be used as the primary propagation medium in these embodiments because the rigid optical fiber may serve as a better propagation medium for acoustic signals than may, for example, the soft jacketing material that may be used on some fiber optic patch cords. Additionally, as the optical fibers are typically buried well within a fiber optic patch cord, acoustic control signals that are transmitted over these optical fibers may be less prone to crosstalk phenomena where a portion of the signal energy is transferred to adjacent cabling, which can possibly lead to "false positives" where crosstalk from an acoustic control signal that is transferred to another patch cord is mistaken as comprising the primary acoustic control signal. Additionally, acoustic control signals that are buried within a patch cord (e.g., are transmitted over an optical fiber within a patch cord) may be less prone to distortion by other acoustic signals that may arise in an intelligent patching system such as, for example, vibrations from network equipment.

Pursuant to further embodiments of the present invention, methods and systems are provided for coupling an acoustic control signal onto an optical fiber. As known to those of skill in the art, a typical optical fiber includes a glass (silica) core that serves as a transmission medium for the optical signal. This core is surrounded by a silica cladding layer. A polymer protective layer such as, for example, an acrylic or polyimide layer, surrounds the cladding layer. In the case of buffered optical fibers, an additional buffer may surround the polymer layer, and may be integral with the polymer layer (in the case of tightly buffered optical fibers), or instead may comprise a tube in which the optical fiber is contained (in the case of loosely buffered optical fibers).

As noted above, in some embodiments of the present invention, the acoustic control signals may be injected onto an optical fiber so that the optical fiber may serve as the primary propagation medium for the acoustic control signal. For at least some acoustic signals, the rigid glass fiber may serve as a low-loss propagation medium. In order to transmit the acoustic signal along the glass interior of the optical fiber (i.e., along the core and/or cladding), it may in some cases be necessary to inject the acoustic control signal through the soft polymer layer (since such a layer is provided on most optical fibers), and then at the far end of the optical fiber it will be necessary to extract the optical signal from the core/cladding through the polymer layer for provision to the acoustic signal detector. In other embodiments, the polymer layer may be removed at the point(s) where the acoustic signals are injected onto and extracted from the optical fiber. Such removal of the polymer layer is performed, for example, when commercial optical fibers are terminated onto certain optical connectors (e.g., certain LC, SC, MPO, etc. connectors) so that, for example, the silica cladding layer may be bonded to the rigid ceramic ferrule using a thin rigid layer of epoxy. As is discussed above, in some embodiments the acoustic control signals may be inserted onto an optical fiber and/or extracted therefrom by positioning the acoustic signal generator and/or detector adjacent the ceramic ferrules.

Pursuant to embodiments of the present invention, the manner in which the acoustic control signal is injected through the polymer coating on an optical fiber may be guided by the critical angle reflection principle. In particular, for ultrasound acoustic signals, the propagation velocity of an acoustic signal passing through the silica exceeds the propagation velocity of the same acoustic signal as is passes through the polymer layer. As such, according to the critical angle principle, the angle at which the acoustic signal is injected into the optical fiber will change at the interface between the polymer and silica materials. According to some embodiments of the present invention, it may be desirable to have the acoustic signal enter the silica portion of the optical fiber at a relatively "flat" angle so that the acoustic signal generally is travelling in the longitudinal or axial direction of the optical fiber. However, it may also be desirable, in some embodiments, that the acoustic signal not travel at too flat an angle, as this may cause the acoustic signal to travel mostly upon the outer surface of the silica as opposed to being transmitted through the core of the optical fiber. Pursuant to embodiments of the present invention, the acoustic control signal may be injected onto an optical fiber in a manner such that the acoustic control signal will have good transmission characteristics on the optical fiber.

Figure 7:
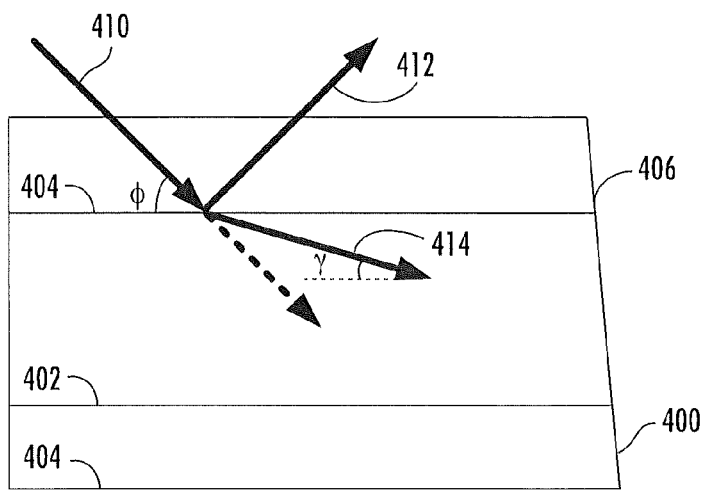
FIG. 7 is a schematic diagram that illustrates the angle at which acoustic control signals according to embodiments of the present invention may be injected onto an optical fiber in order to achieve good propagation along the optical fiber.

In particular, as shown in FIG. 7, an optical fiber 400 includes a central glass (silica) core (that includes the cladding) 402 that is surrounded by an acrylic (or other polymer) layer 404. The optical fiber 400 may comprise a long, thin wire that has a cylindrical shape when stretched taut. Herein, the axis that runs through the center of such a cylindrical optical fiber defines the "longitudinal" direction of the optical fiber, and a cross-section that is taken through the optical fiber at an angle that is normal to the longitudinal direction is referred to as a "transverse" cross-section. FIG. 7 depicts a cross-section of a small longitudinal portion of the optical fiber 400 where the cross-section is taken along the longitudinal direction through the center of the optical fiber 400.

As shown in FIG. 7, an acoustic control signal 410 may be injected into the optical fiber 400. The "angle of incidence" $\phi$ of the acoustic control signal is the angle between the vector that runs though the center of the mechanical wave that comprises the acoustic control signal and a longitudinal cross-section of the optical fiber. The injected acoustic control signal 410 is referred to herein as the "incident acoustic control signal" 410. As is further shown in FIG. 7, when the incident acoustic control signal 410 reaches the interface between the acrylic layer 404 and the silica core 402 of the optical fiber 400, part of the signal energy is reflected back out of the optical fiber. This signal is referred to herein as the "reflected acoustic control signal" 412. The remainder of the incident acoustic control signal 410 penetrates the interface and travels into the glass core 402 of the optical fiber 400. This signal is referred to herein as the "injected acoustic control signal" 414. It will be appreciated that an injected acoustic control signal will typically travel in both directions along the optical fiber 400, and not just in the direction of the vector 414 depicted in FIG. 7. The magnitude of the injected acoustic control signal that travels in each direction down the optical fiber 400 will vary depending upon a number of factors including, for example, the angle of incidence.

As is also shown in FIG. 7, because the propagation velocity of the injected acoustic control signal 414 exceeds the propagation velocity of the incident acoustic control signal 410 (due to the fact these signals are passing through different materials), the angle of incidence for the injected acoustic control signal 414 is reduced or "flattens" as the acoustic signal enters the glass core 402. As a result, the injected acoustic control signal 414 may travel in a direction that is closer to the longitudinal direction. As the injected acoustic control signal 414 travels along the optical fiber 400, it will bounce between the bottom of the glass core 402 and the top of the glass core 402, and may lose some amount of signal energy each time the signal hits the interface between the glass core 402 and the acrylic layer 404 due to some signal energy penetrating this interface and travelling out of the optical fiber. However, the flatter the angle of the injected acoustic control signal 414, the less signal energy that may be lost each time the acoustic control signal 414 hits an interface between the glass core 402 and the acrylic layer 404.

Pursuant to some embodiments of the present invention, the acoustic control signal may be injected into an optical fiber at an angle of incidence of between about 22 degrees and about 32 degrees. In typical optical fibers, this may result in an injected acoustic control signal 414 that propagates at a relatively flat angle through the glass core 402 of the optical fiber 400. In some embodiments, the characteristics of the optical fiber and the acoustic control signal may be selected so that the angle of propagation γ for the injected acoustic control signal 414 through the optical fiber is between about 0 degrees and about 5 degrees.

While the above description with respect to FIG. 7 methods for injecting a longitudinal wave into an optical fiber that may, for certain types of optical fibers, have desirable transmission characteristics, it will be appreciated that the injection of a longitudinal wave into an optical fiber will typically also result in the injection of a shear wave into the optical fiber as well, as is shown by the dashed vector in FIG. 7. Pursuant to further embodiments of the present invention, this shear wave could be used as the acoustical control signal. It will be appreciated that the shear wave has a significant radial component, and hence it may be easier to extract signal energy at the far end of the optical fiber at the acoustic signal detector than is the case with a longitudinal wave. However, the shear wave may also experience greater attenuation for the same reason. When shear waves are used to carry the control information, in some embodiments the angle of incidence for the acoustic signal may be, for example, about 45 degrees to about 52 degrees.

It is also necessary to extract the acoustic control signal from the optical fiber at the far end of the optical fiber so that the acoustic signal may be detected by an acoustic signal detector. In some embodiments, this may be accomplished by detecting the portion of an acoustic control signal that "escapes" the optical fiber when the injected acoustic control signal 414 bounces back into the center of the optical fiber upon hitting the interface between the glass core 402 and the acrylic layer 404. In other embodiments, other steps may be taken to ensure that a larger amount of signal energy is extracted from the glass core 402 of the optical fiber 400 at the location of the acoustic signal detector.

For example, in some embodiments, the end of each optical fiber may be polished or cut to have a bevel instead of having the end of each optical fiber be at an angle normal to the longitudinal direction. Such a beveled end of the optical fiber is shown schematically in FIG. 7 at the end 406 of optical fiber 400. The beveled end 406 may act to reflect a portion of the injected acoustic control signal 414 out of the optical fiber 400 so that this signal energy may be detected by an acoustic signal detector.

Pursuant to further embodiments of the present invention, the presence of an acoustical signal on an optical fiber may be sensed using a radial ultrasound detector that senses the radial contraction/expansion of the optical fiber that appears due to the Poisson ratio of the material when a longitudinal wave propagates through the fiber. The Poisson ratio refers to the ratio of the transverse strain to the axial or longitudinal strain. Notably, measuring the physical changes that occur to the optical fiber when the mechanical wave propagates along the optical fiber does not require extracting the acoustic signal from the fiber. As such, the acoustic signal may be designed to have low attenuation in the optical fiber. Using a radial ultrasound detector or other equivalent device to detect the presence of an acoustic control signal on an optical fiber may be particularly appropriate in intelligent patching systems that rely on detecting the presence or absence of acoustic control signals to map the patching connections.

As noted above, acoustical signals comprise mechanical waves. These mechanical waves can take on a number of different forms, including pressure waves (which are also referred to as longitudinal waves), shear waves (which are also referred to as transverse waves), surface waves (which may appear, for example, on the surface of a material such as at the interface between the glass core and acrylic coating of an optical fiber) and torsional waves. As discussed below, pursuant to some embodiments of the present invention, the acoustic control signals may be transmitted as pressure waves within certain frequency ranges that may provide for low-loss propagation along the optical fiber.

Figure 8A:
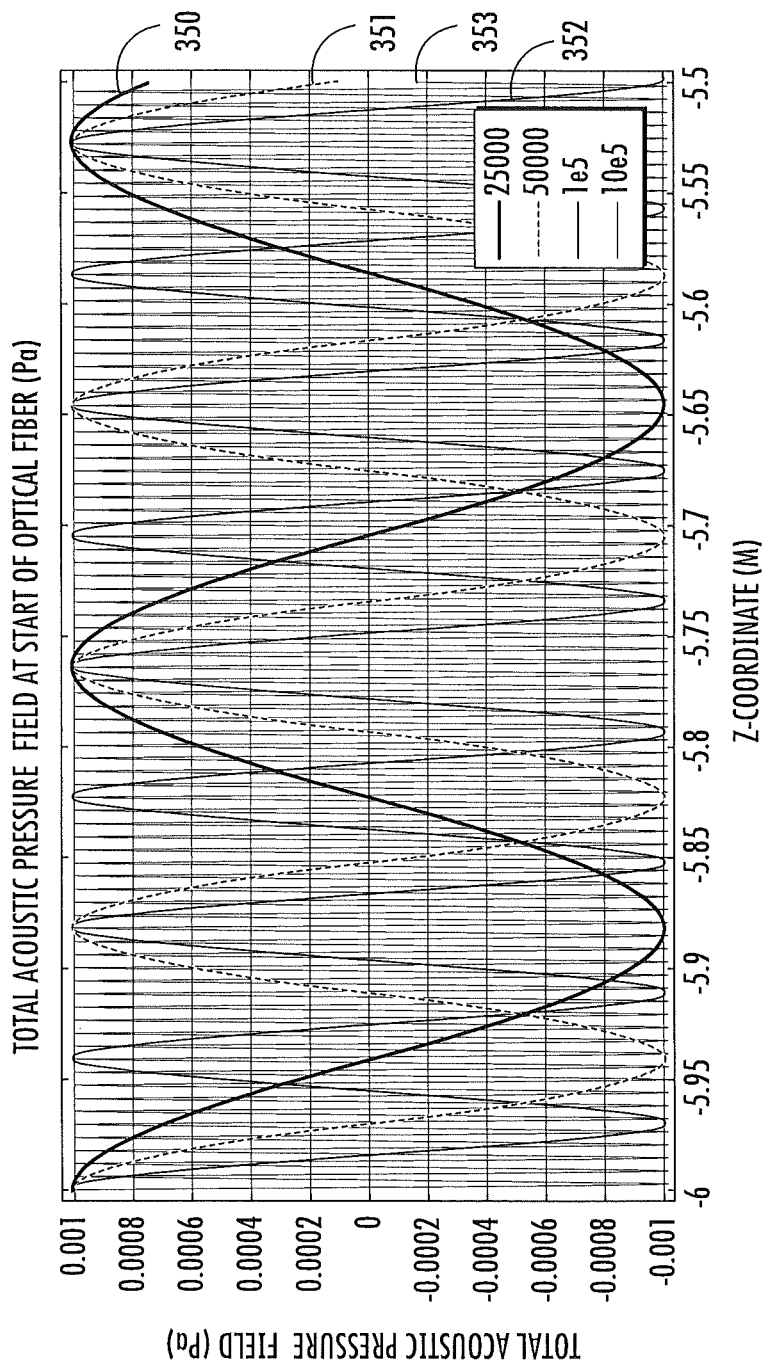
FIGS. 8A and 8B are graphs that illustrate the simulated total acoustic pressure field at the start of an optical fiber for acoustic control signals having various frequencies.
Figure 8B:
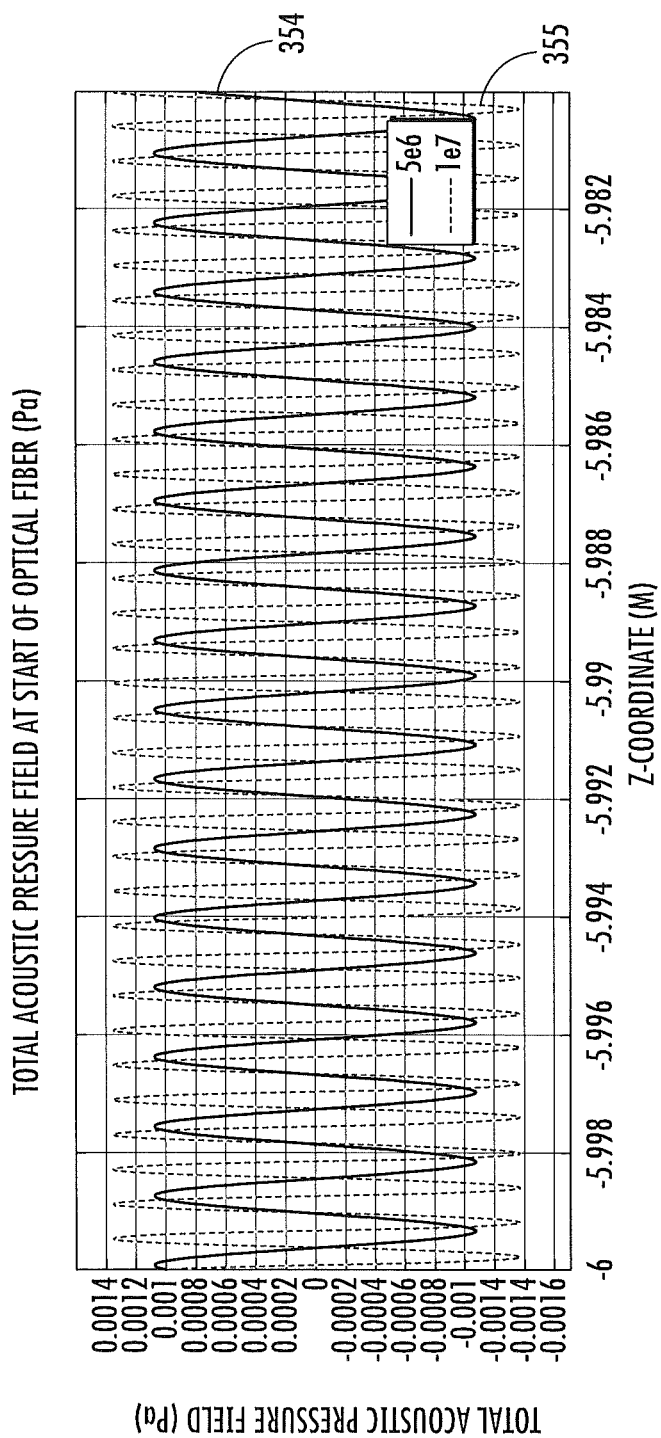
Figure 8C:
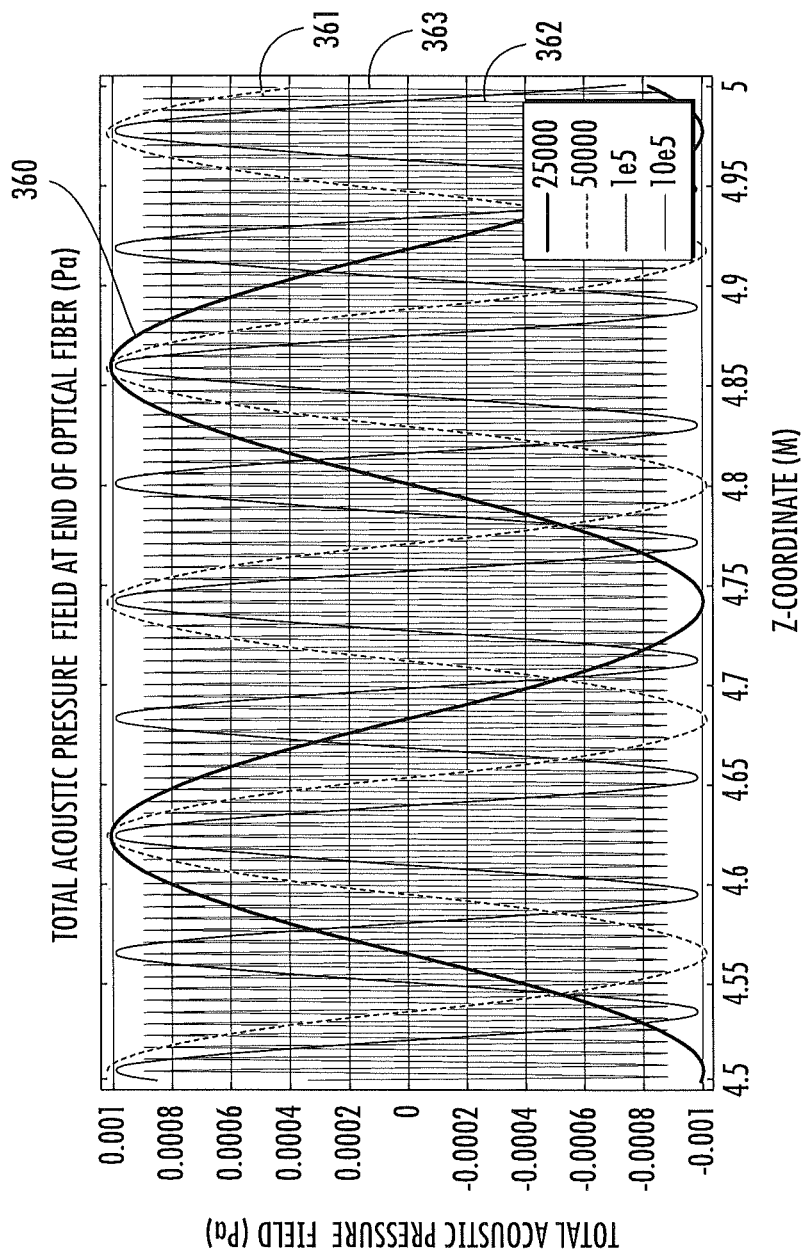
FIGS. 8C and 8D are graphs that illustrate the simulated total acoustic pressure field at the end of the optical fiber for each of the acoustic control signals of FIGS. 8A and 8B.
Figure 8D:
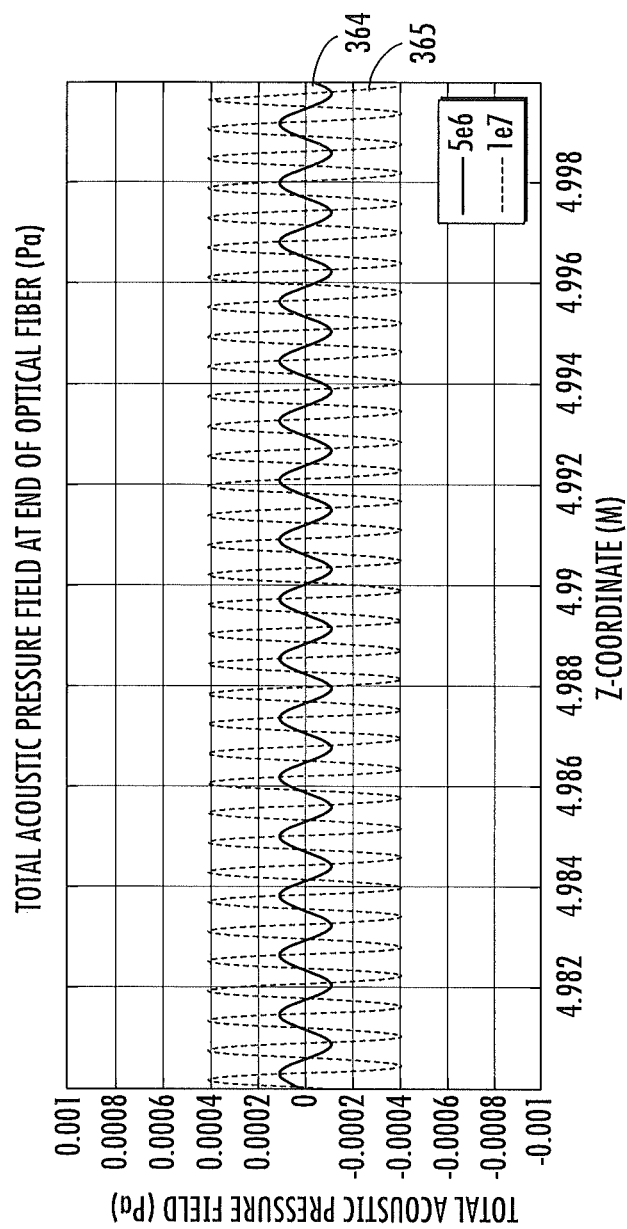

In particular, it has been discovered that optical fibers may act as a particularly good transmission medium for lower frequency pressure acoustical waves. By way of example, finite element analysis modeling was performed for a 16 foot optical fiber. These simulations modeled the transmission of acoustical signals having frequencies of 25 kHz, 50 kHz, 100 KHz, 1 MHz, 5 MHz and 10 MHz were transmitted over such a 16-foot optical fiber. FIG. 8A illustrates the simulated total acoustic pressure field at the start of the optical fiber for the 25 kHz (curve 350), 50 kHz (curve 351), 100 KHz (curve 352) and 1 MHz (curve 353) acoustic signals. FIG. 8B illustrates the simulated total acoustic pressure field at the end of the optical fiber for the 25 kHz (curve 360), 50 kHz (curve 361), 100 KHz (curve 362) and 1 MHz (curve 363) acoustic signals. Similarly, FIG. 8C illustrates the simulated total acoustic pressure field at the start of the optical fiber for the 5 MHz (curve 354) and 10 MHz (curve 355) acoustic signals. FIG. 8D illustrates the simulated total acoustic pressure field at the end of the optical fiber for the 5 MHz (curve 364) and 10 MHz (curve 365) acoustic signals.

As shown in FIGS. 8A-D, the simulations indicate that the 25 KHz, 50 kHz and 100 kHz signals did not experience any significant attenuation in being transmitted over the optical fiber (i.e., the amplitude of curves 360, 361 and 362 are approximately the same as the amplitude of curves 350, 351 and 352, respectively). However, the 1 MHz acoustic signal experienced a 13% reduction in total acoustic pressure amplitude (i.e., the amplitude of curve 363 is approximately 13% less than the amplitude of curve 353), the 5 MHz acoustic signal experienced a 91% reduction in total acoustic pressure amplitude (i.e., the amplitude of curve 364 is approximately 13% less than the amplitude of curve 354), and the 10 MHz acoustic signal experienced a 69% reduction in total acoustic pressure amplitude (i.e., the amplitude of curve 365 is approximately 13% less than the amplitude of curve 355). Thus, ultrasonic acoustic signals at frequencies of 1 MHz or less may be used in certain embodiments of the present invention as they may experience low loss when propagating along optical fibers.

Figure 9A:
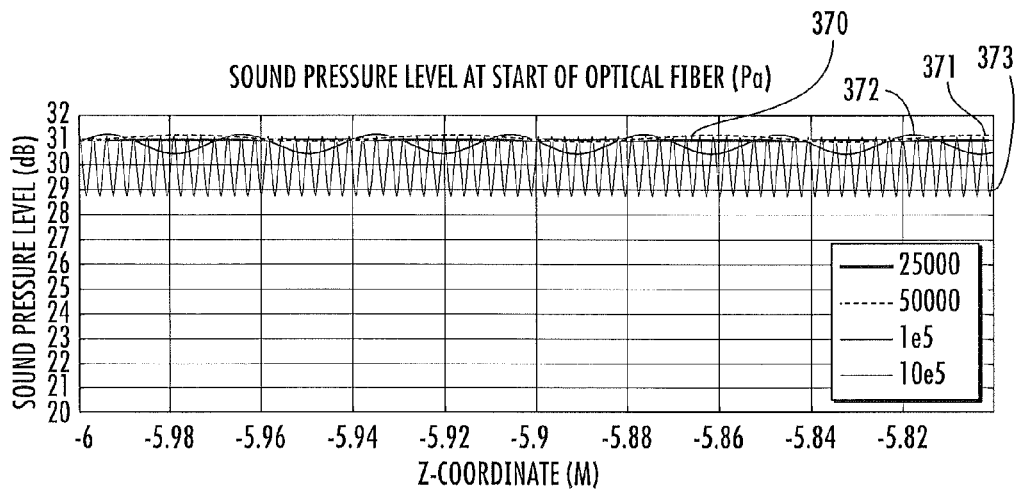
FIGS. 9A and 9B are graphs that illustrate the simulated sound pressure level at the start of an optical fiber for acoustic control signals having various frequencies
Figure 9B:
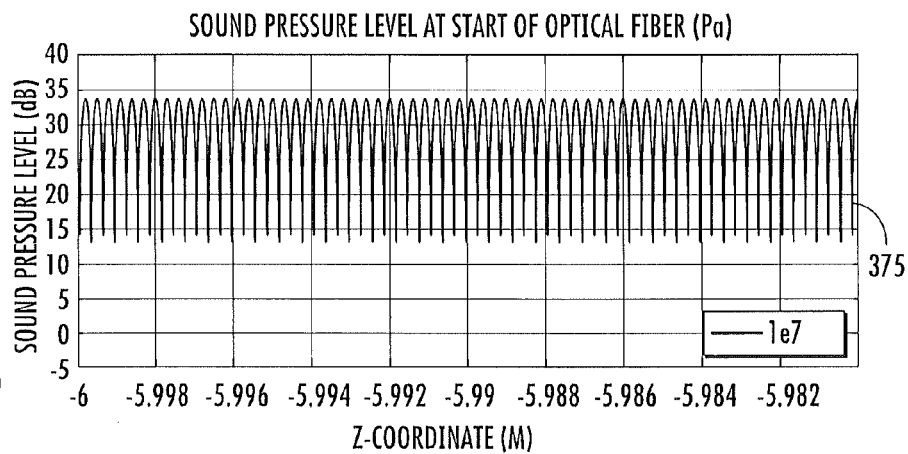
Figure 9C:
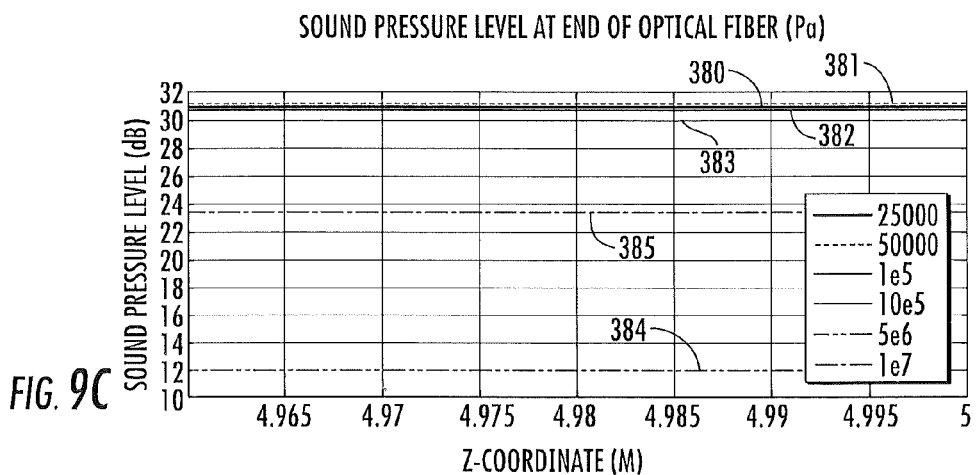
FIG. 9C is a graph that illustrates the simulated sound pressure level at the end of the optical fiber for each of the acoustic control signals of FIGS. 9A and 9B.

FIG. 9A illustrates the simulated sound pressure field at the start of the optical fiber for the 25 kHz (curve 370), 50 kHz (curve 371), 100 KHz (curve 372) and 1 MHz (curve 373) acoustic signals, and FIG. 9B illustrates the simulated sound pressure field at the start of the optical fiber for the 10 MHz (curve 375) acoustic signals (the curve for the 5 MHZ acoustic signal at the start of the optical fiber is not shown in FIG. 8A or 8B for clarity, but has a mean amplitude of about 25 dB). FIG. 9C illustrates the simulated sound pressure field at the end of the optical fiber for the 25 kHz (curve 380), 50 kHz (curve 381), 100 KHz (curve 382), 1 MHz (curve 383), 5 MHz (curve 384) and 10 MHz (curve 385) acoustic signals.

As shown in FIGS. 9A-C, the simulations indicate that the 25 KHz, 50 kHz, 100 kHz and 1 MHz signals did not experience any significant attenuation in being transmitted over the optical fiber (i.e., the amplitude of curves 380, 381, 382 and 383 are approximately the same as the amplitude of curves 370, 371, 372 and 373, respectively). However, the 5 MHz acoustic signal experienced a 52% reduction in total acoustic pressure amplitude (i.e., the mean amplitude dropped from about 25 dB at the start of the optical fiber to about 12 dB at the end of the optical fiber), and the 10 MHz acoustic signal experienced a 6% reduction in total acoustic pressure amplitude (i.e., the mean amplitude dropped from about 25 dB at the start of the optical fiber to about 23.5 dB at the end of the optical fiber). Once again, this illustrates that ultrasonic acoustic signals at frequencies of 1 MHz or less may be desirable in certain embodiments of the present invention as they may experience low loss when propagating along optical fibers.

While the present invention is described above with reference to drawings that illustrate preferred embodiments thereof, it will be appreciated that the present invention may be embodied in many different forms and should not be construed as limited to the embodiments set forth herein. Instead, these embodiments are provided so that this disclosure will be thorough and complete, and will fully convey the scope of the invention to those skilled in the art. In the drawings, the size of lines and elements may be exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will also be understood that when an element is referred to as being "coupled" to another element, it can be coupled directly to the other element, or intervening elements may also be present. In contrast, when an element is referred to as being "directly coupled" to another element, there are no intervening elements present. Likewise, it will be understood that when an element is referred to as being "connected" or "attached" to another element, it can be directly connected or attached to the other element or intervening elements may also be present. In contrast, when an element is referred to as being "directly connected" or "directly attached" to another element, there are no intervening elements present. Other words used to describe the relationship between elements should be interpreted in a like fashion (i.e., "between" versus "directly between", "adjacent" versus "directly adjacent", etc.).

All embodiments disclosed above can be combined in any way and/or combination to provide additional embodiments of the present invention.

Unless otherwise defined, all technical and scientific terms used herein have the same meaning as commonly understood by one of ordinary skill in the art to which this invention belongs. The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. As used herein, the term "and/or" includes any and all combinations of one or more of the associated listed items.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of identifying a patching connection in a communications system, the method comprising:
    using an acoustic signal generator to transmit an acoustic signal that includes a unique identifier embedded therein over a patch cord from a first connector port to a second connector port;
    receiving the acoustic signal at the second connector port;
    extracting the unique identifier from the acoustic signal; and
    logging a patching connection between the first connector port and the second connector port in a database.

2. The method of claim 1, wherein the acoustic signal is a vibration signal.

3. The method of claim 1, wherein the acoustic signal is an ultrasonic pressure wave.

4. The method of claim 1, wherein the acoustic signal is a pressure wave that has a frequency between about 20 kHz and about 2 MHz.

5. The method of claim 1, wherein the unique identifier is embedded in the acoustic signal by encoding the unique identifier into one or more of a frequency of the acoustic signal, an amplitude of the acoustic signal and/or a duration of the acoustic signal.

6. The method of claim 1, wherein the acoustic signal comprises a series of discrete acoustic signals, and wherein the unique identifier is embedded in the acoustic signal by encoding the unique identifier into one or more of a frequency of one or more of the discrete acoustic signals, an amplitude of one or more of the discrete acoustic signals, the duration of one or more of the discrete acoustic signals and/or an interval length between ones of the discrete acoustic signals.

7. The method of claim 1, wherein extracting the unique identifier from the acoustic signal comprises:
    using an acoustic signal detector to convert the received acoustic signal into an electrical signal; and then
    extracting the unique identifier from the electrical signal.

8. The method of claim 1, wherein using the acoustic signal generator to transmit the acoustic signal that includes the unique identifier embedded therein over the patch cord from the first connector port to the second connector port comprises energizing a sleeve that receives a ferrule of a termination of the patch cord to cause the sleeve to inject the acoustic signal onto an optical fiber of the patch cord.

9. The method of claim 1, wherein using the acoustic signal generator to transmit the acoustic signal that includes the unique identifier embedded therein over the patch cord from the first connector port to the second connector port comprises injecting the acoustic signal through a ferrule of a termination of the patch cord onto an optical fiber of the patch cord.

10. A method of identifying a patching connection in a communications system, the method comprising:
   using an acoustic signal generator to generate an acoustic control signal;
   injecting the acoustic control signal through an acoustically active ferrule onto an optical fiber of a fiber optic patch cord that is received in a first connector port; and
   extracting the acoustic control signal from the optical fiber at a second connector port;
   identifying that a patching connection extends between the first connector port and the second connector port based at least in part on receipt of the acoustic control signal at the second connector port.

11. The method of claim 10, wherein the acoustic control signal is injected into the optical fiber at an angle of incidence that results in an injected acoustic control signal that propagates through a glass core of the optical fiber at an angle of propagation of between about 0 degrees and about 5 degrees.

12. The method of claim 10, wherein the acoustic control signal is an ultrasonic pressure wave that has a frequency between about 20 kHz and about 2 MHz.

13. The method of claim 10, wherein extracting the acoustic control signal from the optical fiber at a second connector port comprises beveling an end of the optical fiber to increase the amount of signal energy from the acoustic control signal that is extracted from the optical fiber at the second connector port.

14. The method of claim 10, wherein the acoustic signal generator is located in a termination of a patch cord that is received within the first connector port, the method further comprising coupling a control signal from a controller associated with a patch panel that includes the first connector port to the acoustic signal generator.

15. The method of claim 10, wherein the acoustic signal generator at least partially surrounds a sleeve that is located within the connector port and that receives the acoustically active ferrule, the method further comprising injecting the acoustic control signal through the sleeve prior to injecting the acoustic control signal through the acoustically active ferrule.

* * * * *